(12) United States Patent
Nierop et al.

(10) Patent No.: US 11,079,432 B2
(45) Date of Patent: Aug. 3, 2021

(54) INTEGRATED LASER VOLTAGE PROBE PAD FOR MEASURING DC OR LOW FREQUENCY AC ELECTRICAL PARAMETERS WITH LASER BASED OPTICAL PROBING TECHNIQUES

(71) Applicant: NPX B.V., Eindhoven (NL)

(72) Inventors: Pieter Gustaaf Nierop, Nijmegen (NL); Gerben Boon, Ottersum (NL); Harry Bernardus Antonius Kerver, Duiven (NL)

(73) Assignee: NXP B.V., Eindhoven (NL)

( * ) Notice: Subject to any disclaimer, the term of this patent is extended or adjusted under 35 U.S.C. 154(b) by 99 days.

(21) Appl. No.: 16/279,304

(22) Filed: Feb. 19, 2019

(65) Prior Publication Data
US 2020/0264232 A1 Aug. 20, 2020

(51) Int. Cl.
*G01R 31/317* (2006.01)
*G01R 31/3185* (2006.01)

(52) U.S. Cl.
CPC . *G01R 31/31728* (2013.01); *G01R 31/31707* (2013.01); *G01R 31/318505* (2013.01)

(58) Field of Classification Search
None
See application file for complete search history.

(56) References Cited

U.S. PATENT DOCUMENTS

| | | | |
|---|---|---|---|
| 5,850,408 A | * | 12/1998 | Ouchi .................... B82Y 20/00 372/27 |
| 5,872,360 A | | 2/1999 | Paniccia et al. |
| 6,882,172 B1 | | 4/2005 | Suzuki et al. |
| 7,256,055 B2 | | 8/2007 | Aghababazadeh et al. |
| 7,291,508 B2 | | 11/2007 | Ortega |
| 2005/0280477 A1 | | 12/2005 | Reddy et al. |
| 2006/0033800 A1 | * | 2/2006 | Akamatsu ............. G01J 1/4228 347/129 |
| 2006/0282726 A1 | | 12/2006 | Katsuzawa |
| 2007/0236248 A1 | * | 10/2007 | Park ..................... G11C 7/1048 326/30 |
| 2009/0040904 A1 | * | 2/2009 | Matsumoto ............. A61P 31/04 369/112.23 |
| 2015/0204917 A1 | | 7/2015 | Priel et al. |

* cited by examiner

*Primary Examiner* — Jermele M Hollington

(57) ABSTRACT

A semiconductor or integrated circuit block including a sense node and a converter circuit, in which the sense node develops a low frequency electrical parameter that is constant or varies at a frequency below a predetermined frequency level, and in which the converter circuit converts the low frequency electrical parameter into an alternating electrical parameter having a frequency at or above the predetermined frequency level sufficient to modulate a laser beam focused within a laser probe area of the converter circuit. The converter may include a ring oscillator, a switch circuit controlled by a clock enable signal, a capacitor having a charge rate based on the low frequency electrical parameter, etc. The laser probe area has a frequency level based on a level of the low frequency electrical parameter to modulate the reflected laser beam for measurement of the electrical parameter by a laser voltage probe test system.

13 Claims, 10 Drawing Sheets

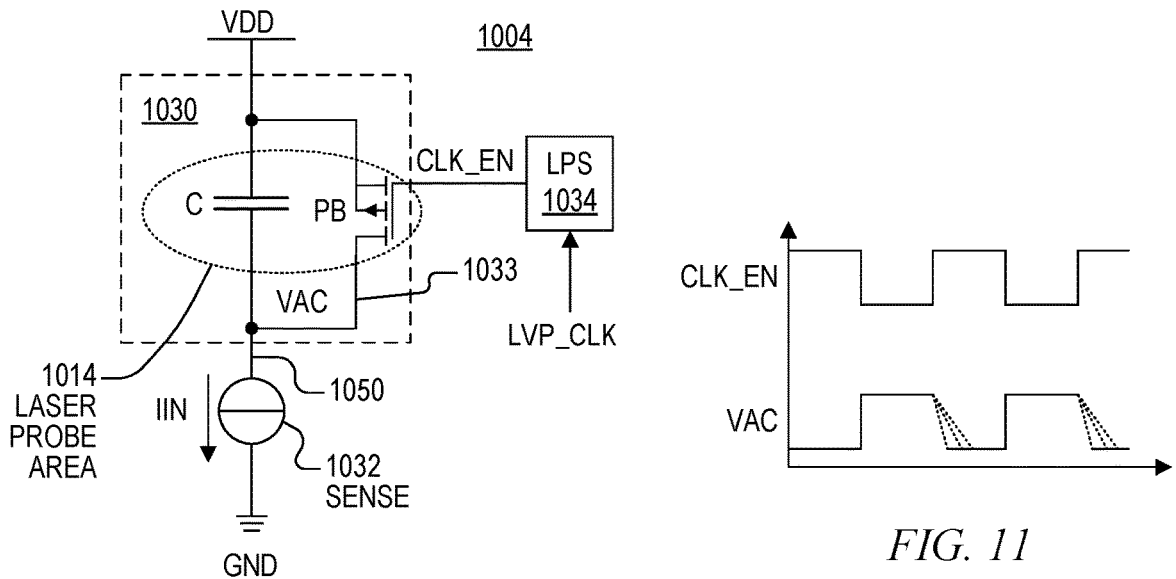
FIG. 10
FIG. 11
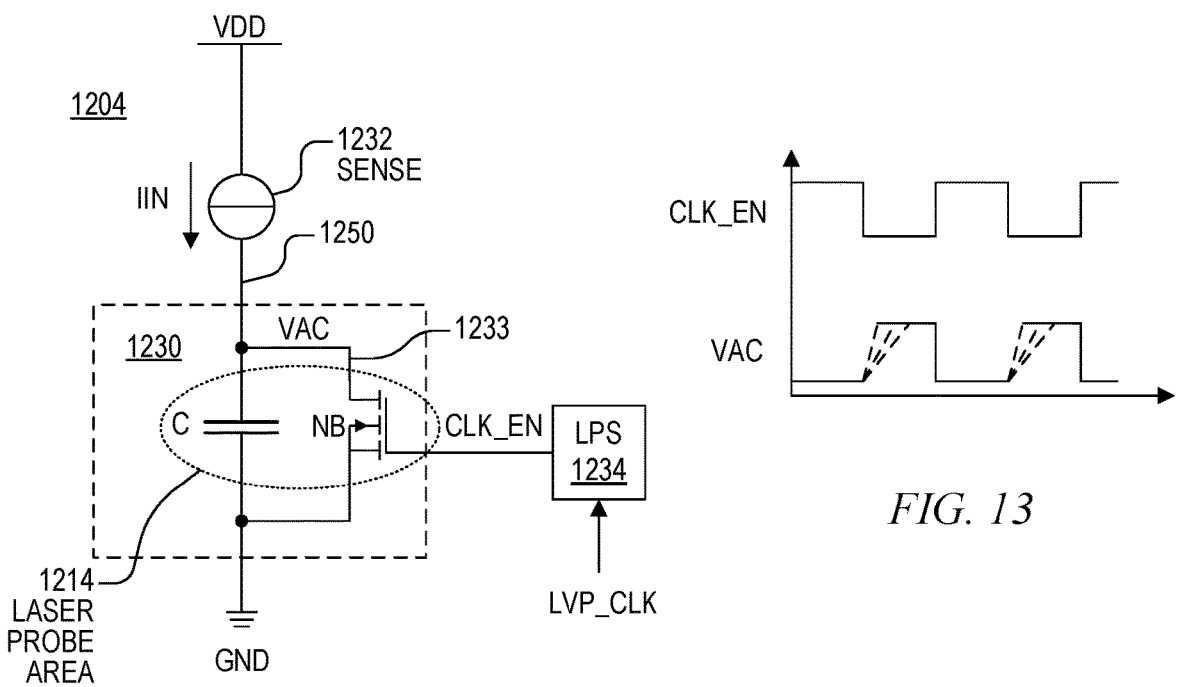
FIG. 12
FIG. 13

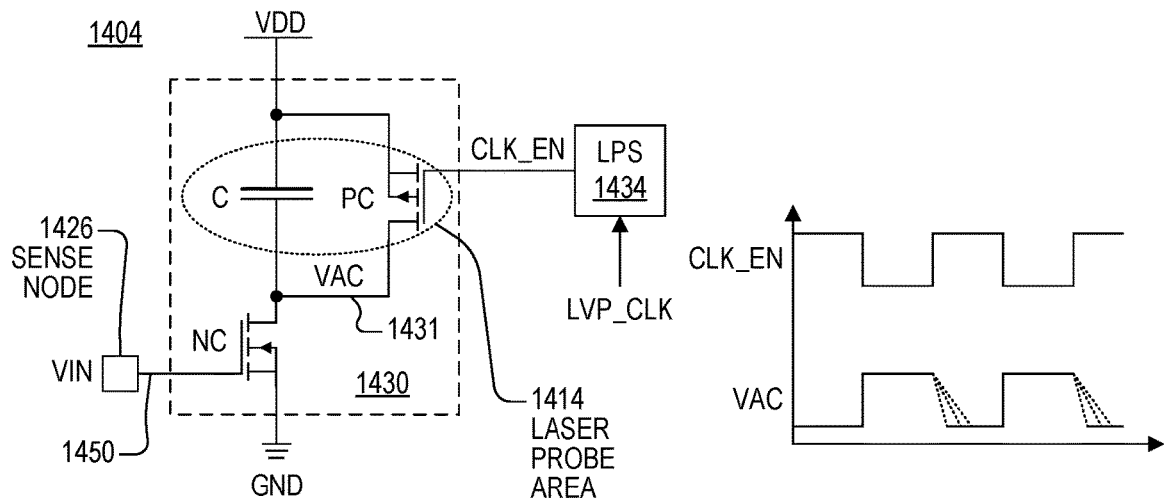
FIG. 14
FIG. 15
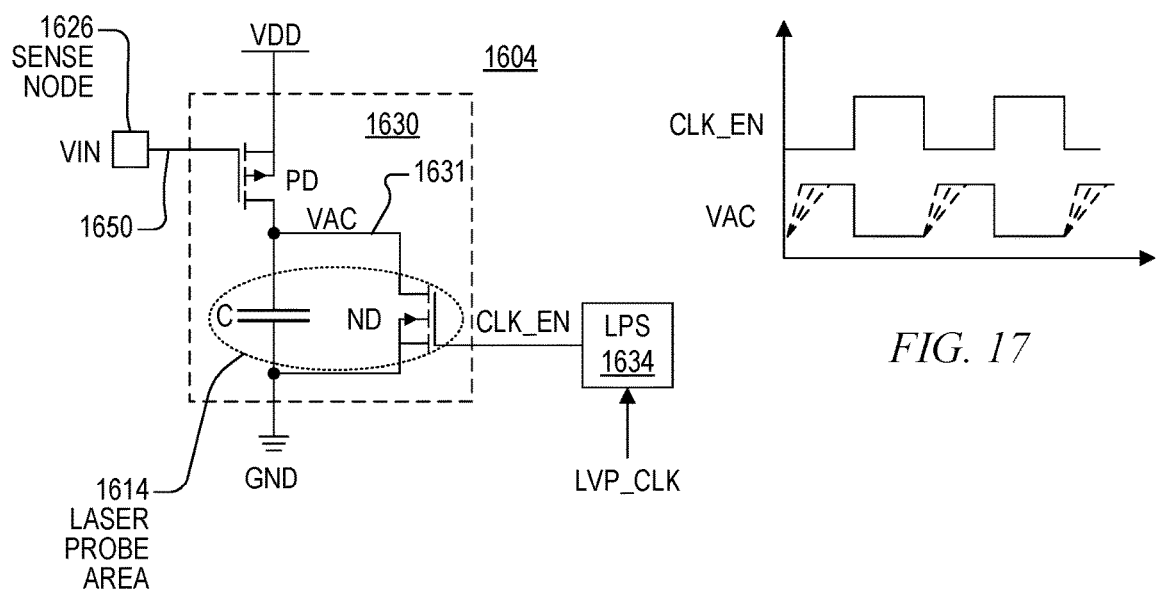
FIG. 16
FIG. 17

INTEGRATED LASER VOLTAGE PROBE PAD FOR MEASURING DC OR LOW FREQUENCY AC ELECTRICAL PARAMETERS WITH LASER BASED OPTICAL PROBING TECHNIQUES

BACKGROUND OF THE INVENTION

Field of the Invention

The present invention relates in general to laser voltage probing, and more specifically to an integrated laser voltage probe pad for measuring constant or low frequency alternating electrical signals with laser based optical probing techniques.

Description of the Related Art

Laser based optical probing techniques are commonly used in failure analysis of an integrated circuit (IC) or semiconductor device that has failed. These techniques, however have not been able to measure direct current (DC) electrical parameters such as DC voltage and current levels. Also, laser based optical probing techniques are unable to detect alternating current (AC) electrical parameters that operate at a frequency below a predetermined minimum frequency FMIN, which, together with the inability to detect DC parameters, limited these techniques mostly to the digital IC domain for measuring internal nodes that carry or convey alternating electrical parameters at or above FMIN. In the analog domain, constant or low frequency alternating electrical parameters are more common. Up until now, micro-probing techniques have been required to accurately measure these constant or low frequency alternating electrical parameters. Micro-probing techniques required sample-preparation with, for example, Focused Ion Beam (FIB) and also required direct contact with the internal node to be measured. The direct contact of the IC by a probe-needle presents a significant risk of damaging the semiconductor device. Other than the risk of permanent damage, direct contact with a probe-needle often affects the measured parameters potentially resulting in less accurate or even erroneous results.

BRIEF DESCRIPTION OF THE DRAWINGS

Embodiments of the present invention are illustrated by way of example and are not limited by the accompanying figures. Similar references in the figures may indicate similar elements. Elements in the figures are illustrated for simplicity and clarity and have not necessarily been drawn to scale.

FIG. 10 is a schematic and block diagram of a device under test implemented according to another embodiment in which a capacitor is repeatedly charged and discharged to convert a DC or low frequency current signal into an alternating voltage signal VAC having a frequency at or above FMIN for laser detection.

FIG. 11 is a graphic diagram plotting CLK_EN and VAC versus time for the device under test of FIG. 10 when its converter is enabled in which VAC ramps down at a rate based on an input current IIN.

FIG. 12 is a schematic and block diagram of a device under test implemented according to another embodiment in which a capacitor C is repeatedly charged and discharged to convert a DC or low frequency current signal into an alternating signal VAC having a frequency at or above FMIN for laser detection.

FIG. 13 is a graphic diagram plotting CLK_EN and VAC versus time for the device under test of FIG. 12 when its converter is enabled in which VAC ramps up at a rate based on an input current IIN.

FIG. 14 is a schematic and block diagram of a device under test in which a capacitor C is repeatedly charged and discharged to convert a DC or low frequency voltage signal into an alternating signal having a frequency at or above FMIN for laser detection.

FIG. 15 is a graphic diagram plotting CLK_EN and VAC versus time for the device under test of FIG. 14 when its converter is enabled in which VAC ramps down at a rate based on an input voltage VIN.

FIG. 16 is a schematic and block diagram of a device under test in which a capacitor C is repeatedly charged and discharged to convert a DC or low frequency voltage signal into an alternative signal having a frequency at or above FMIN for laser detection.

FIG. 17 is a graphic diagram plotting CLK_EN and VAC versus time for the device under test of FIG. 16 when its converter is enabled in which VAC ramps up at a rate based on an input voltage VIN.

DETAILED DESCRIPTION

The inventors have recognized that standard laser based optical probing techniques are not adequate for measuring DC electrical parameters or low frequency AC electrical parameters of an integrated circuit (IC) or semiconductor device. They have also recognized the deficiencies and risks of micro-probing techniques that have been used for measuring such parameters. The term "electrical parameter" in general refers to any electrical signal, value, or variable that is developed on the IC or semiconductor device when powered, such as electrical current, electrical voltage, alternating electrical signals, etc. As used herein, a "low frequency electrical parameter" includes any DC electrical parameter or any AC electrical parameter that varies or alternates at a frequency below a predetermined minimum frequency level FMIN. As used herein, a "high frequency electrical parameter" includes any electrical parameter that varies or alternates at a frequency at or above FMIN for detection using laser based optical probing techniques. FMIN is a minimum frequency level that is detectable by a laser voltage probe system. In particular, a laser beam focuses on a point within a laser probe area carrying an electrical signal alternating at or above FMIN is modulated and detectable by the laser voltage probe system.

Given the deficiencies of conventional configurations, the inventors have therefore developed an integrated laser voltage probe pad provided on an IC or semiconductor device that enables measuring such low frequency electrical parameters (including DC parameters) using laser based optical probing techniques. A converter circuit is coupled to a sense node that contains or otherwise carries the low frequency electrical parameter, in which the converter circuit converts the low frequency electrical parameter into high frequency electrical parameter that alternates at a frequency at or above FMIN. The converter may include, for example, a ring oscillator, a switch circuit energized by a high frequency clock signal, a capacitor having a charge rate that is based on the level of the low frequency electrical parameter, etc. The converter circuit also includes a laser probe area that is energized by the high frequency electrical parameter such that it modulates the reflected laser beam from an incident laser beam focused on a point within the laser probe area for detection by a laser voltage probe test system. The integrated laser voltage probe pad, therefore, enables measurement of low frequency electrical parameters (including DC parameters) by the laser voltage probe test system.

Figure 1:
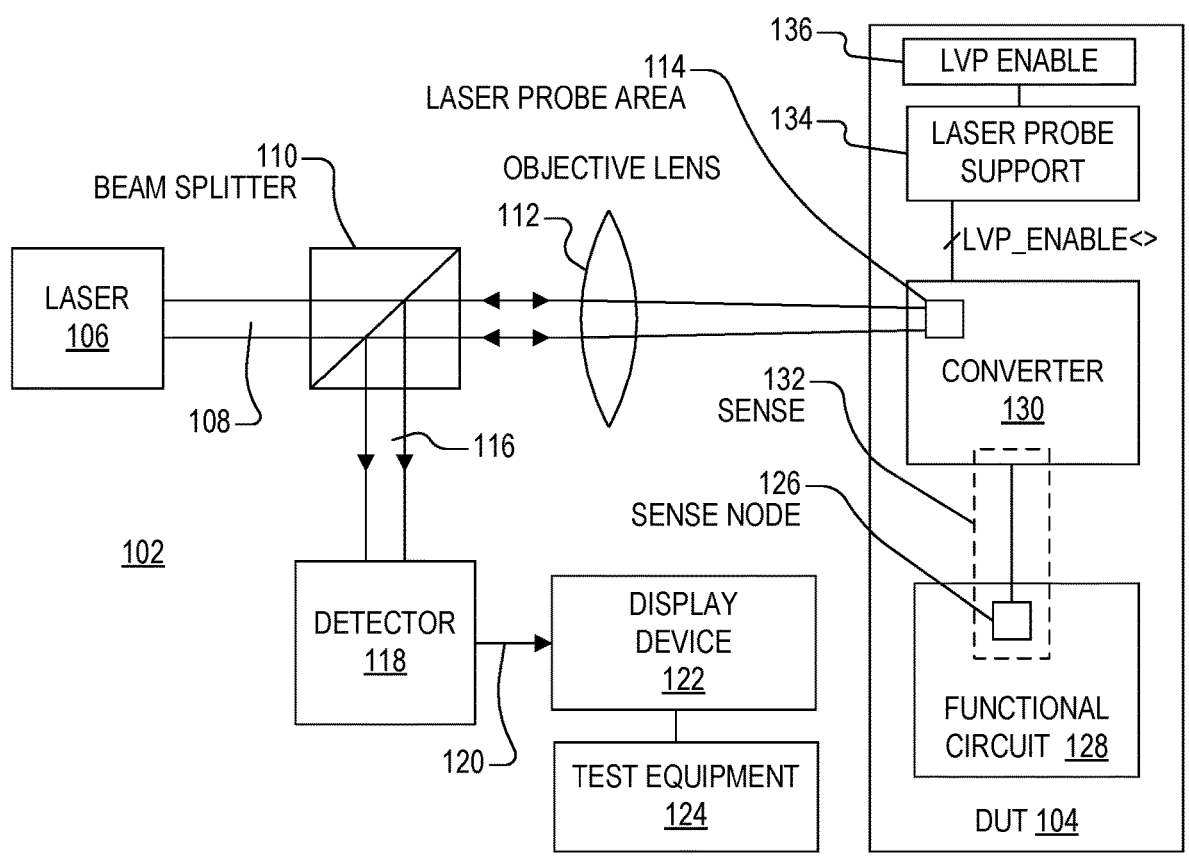
FIG. 1 is a simplified block diagram of a laser voltage probe (LVP) test system used to test an integrated circuit (IC) or semiconductor device shown as a device under test (DUT) including a converter for converting a low frequency electrical parameter to a high frequency electrical parameter that it is detectable by the LVP test system.

FIG. 1 is a simplified block diagram of a laser voltage probe (LVP) test system 102 used to test an integrated circuit (IC) or semiconductor device, such as a device under test (DUT) 104, which includes a converter 130 for converting a low frequency electrical parameter to a high frequency electrical parameter that it is detectable by the LVP test system 102. The LVP test system 102 includes a laser 106 that provides a laser beam 108 focused on a selected active region of the DUT 104. The laser beam 108 passes through a beam splitter 110 and an objective lens 112 which focuses the laser beam 108 on an active region of the DUT 104. The illustrated active region is a laser probe area 114 located on the substrate of the DUT 104. Although not specifically shown, the laser beam 108 passes through the substrate and the laser probe area 114, reflects off interfaces between layers located at the laser probe area 114, and passes back through the laser probe area 114 and the substrate as a reflected laser beam 116. The reflected laser beam 116 returns back through the objective lens 112 and is guided by the beam splitter 110 into a detector 118. The detector 118 generates an output signal 120 that correlates to an electric field generated at the laser probe area 114, in which the output signal 120 is provided to an input of a display device 122 under control of test equipment 124. The display device 122 may be a digital sampling oscilloscope or a frequency analyzer or the like. It is noted that a laser beam is focused on a point within a specified laser probe area identified in the figures suitable to modulate the laser beam, which may not include every possible point within the indicated probe area shown in the figures.

The DUT 104 is "active" in that it is powered and operating in a selected normal operating mode or a selected test mode. Under such powered conditions, the DUT 104 develops many active regions including, for example, the laser probe area 114. The active regions develop an electric field which modulates the reflected laser beam 116, and the detector 118 detects the laser modulations attributed to the electric field to generate the output signal 120. In this manner, the output signal 120 reflects one or more electrical parameters of the electric signal generated at the laser probe area 114. The laser probe area 114 develops or otherwise contains a current or voltage signal that alternates at or above a predetermined minimum frequency level FMIN in order to modulate the laser beam. FMIN may be relatively high, such as 10 kilohertz (kHz) or greater. The LVP test system 102 may be operated at a higher minimum frequency level above FMIN, such as 100 kHz or the like. Such a relatively high frequency level, however, precludes the ability to directly detect locations on the DUT 104 which are operating at a constant level or at a relatively low frequency level (e.g., below 10 kHz).

It is desired, for example, to detect a low frequency electrical parameter (including a DC parameter) associated with a sense node 126 which is part of the functional circuit 128 of the DUT 104. It is noted that the term "functional circuit" is intended to include any number of analog or digital circuits integrated on a semiconductor device or IC performing functional or test operations when the device or IC is powered. The electrical parameter at the sense node 126, which may be either a voltage or a current or the like, is either a constant value or is alternating below FMIN so that it is not directly detectable by the LVP test system 102.

Thus, the converter 130 is implemented (or integrated) onto the substrate of the DUT 104 along with a sense circuit 132 used to convey the electrical parameter to the converter 130. When the electrical parameter is a constant or low frequency voltage, the sense circuit 132 may simply be an electrical conductor that conveys the voltage to the converter 130. When the electrical parameter is a constant or low frequency current, the sense circuit 132 may be or may otherwise include a current mirror branch or the like that develops the current within the converter 130. The converter 130 converts the low frequency electrical parameter to a high frequency electrical parameter at the laser probe area 114 having a frequency level that is above FMIN so that it is detectable by the LVP test system 102. As described further herein, the frequency or other characteristic of the electrical signal at the laser probe area 114 is indicative of the value of the low frequency electrical parameter at the sense node 126, which value is incorporated into the reflected laser signal 116 provided to the detector 118. In this manner, the output signal 120 is indicative of the value of the low frequency electrical parameter at the sense node 126.

The converter 130 is representative of one or more such converters implemented on the DUT 104 as further described herein. During normal operation of the DUT 104, the converter 130 may be disabled or at least configured to consume only a negligible amount of power in order to optimize performance of the functional circuit 128. A laser probe support (LPS) circuit 134 is included to provide one or more enable signals LVP_EN< > to enable or otherwise activate the converter 130 for testing by the LVP test system 102. An LVP enable circuit 136 is provided to enable the LPS circuit 134 as further described herein.

Figure 2:
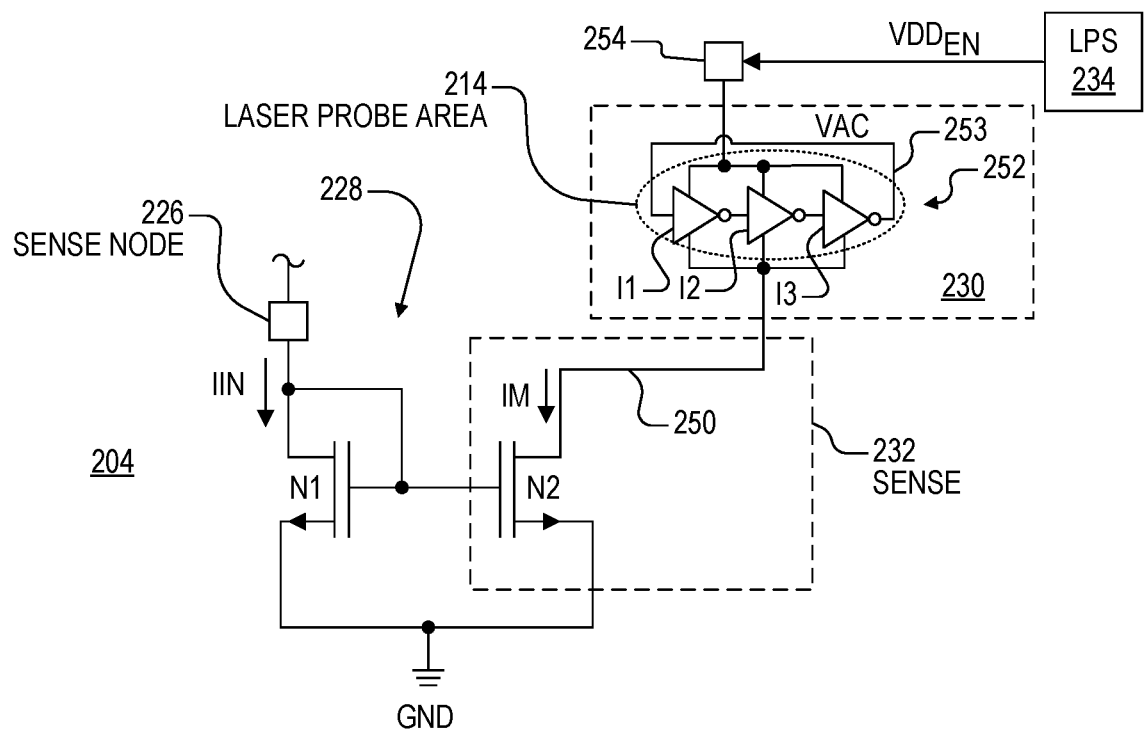
FIG. 2 is a schematic diagram of a device under test implemented according to one embodiment of the present invention using a ring oscillator for converting a DC or low frequency current into a higher frequency signal at or above FMIN.

FIG. 2 is a schematic diagram of a DUT 204 illustrating the DUT 104 implemented according to one embodiment of the present invention using a ring oscillator 252 for converting a DC or low frequency current into a higher frequency signal at or above FMIN. The DUT 204 includes a portion of a functional circuit 228 further including a sense node 226 illustrating a more specific configuration of a small portion of the functional circuit 128 and the sense node 126 of the DUT 104. In this case, the sense node 226 is, or is otherwise part of, an electrical conductor through which a current IIN flows when the DUT 204 is powered. The current IIN is shown flowing into a drain terminal of an N-type (or N-channel) MOS (NMOS) transistor N1 as part of the functional circuit 228. N1 is diode-connected having its drain terminal connected to its gate terminal, and further has a source terminal coupled to a reference supply voltage level, such as ground (GND). The electrical current IIN is a low frequency electrical parameter that is either constant or alternates at a relatively low frequency level below FMIN. Nonetheless, it is desired to detect the value of IIN using the LVP test system 102, which can only detect high frequency electrical parameters that alternate at or above FMIN. The DUT 204 further includes a sense circuit 232 illustrating an embodiment of the sense circuit 132 for detecting IIN. The sense circuit 232 includes another NMOS transistor N2, having a gate terminal coupled to the gate and drain terminals of N1, and having a source terminal coupled to a reference supply voltage level, such as GND. In this manner, N2 is added and coupled to N1 into a current mirror configuration in which a mirrored current IM flows into the drain terminal of N2 having a current level equal to or otherwise proportional to IIN.

It is noted that N1 is depicted as a portion of a current mirror that is already a part of the underlying functional circuit, in which additional current branches (not shown) may be included for mirroring TIN into other portions of the functional circuit 228. In this case, N2 is an added current mirror branch for developing IM based on IIN. N2 may be implemented to have the same size as N1 so that IM is substantially equal to IIN, or N2 may be sized at a multiple of the size of N1 to adjust the magnitude of IM relative to IIN. In functional circuit configurations in which IIN is not already configured to flow into a current mirror branch (e.g., N1 or the like is not already provided), then the sense circuit 232 incorporates additional devices, such as N1, for implementing a current mirror to develop the mirrored current (e.g., IM).

The sense circuit 232 further includes an electrical conductor 250, such as a conductive trace or the like, to convey IM to a converter 230. The converter 230 is a more specific embodiment of the converter 130. In this case the converter 230 includes the ring oscillator 252 configured with three (or any odd number of) inverters I1, I2, and I3 coupled in series and a feedback node 253 coupled between its input and output developing an alternating voltage VAC. As shown, for example, the output of I1 is coupled to the input of I2, having its output coupled to the input of I3, having its output fed back to the input of I3 via the feedback node 253. Any one of the inverters I1-I3 includes a PN junction serving as a laser probe area 214 implementing the laser probe area 114. Each of the inverters I1-I3 has a lower supply voltage terminal coupled to the electrical conductor 250, and an upper supply voltage terminal coupled to a supply enable 254. The supply enable 254 receives a VDD enable signal $VDD_{EN}$ from a laser probe support (LPS) circuit 234 implementing an embodiment of the LPS circuit 134. In one embodiment, the supply enable 254 is a node receiving $VDD_{EN}$ as a supply voltage VDD from the LPS circuit 234 which supplies VDD to enable the converter 230. In another embodiment, the supply enable 254 is a switch coupled between the supply voltage VDD and the upper supply voltage terminals of the inverters of the ring oscillator 252, in which the LPS circuit 234 asserts $VDD_{EN}$ as a logic signal that closes the switch to couple VDD to the converter 230.

In operation, the LPS circuit 234 may assert $VDD_{EN}$ to an appropriate level (e.g., low) to disable or turn off the converter 230. When disabled, the converter 230 does not affect operation of the functional circuit 228. When the LPS circuit 234 asserts $VDD_{EN}$ to an appropriate enable level (e.g., high), then the converter 230 is activated and the ring oscillator 252 oscillates VAC at a frequency based on the delay of each of the inverters I1-I3, in which the delay of each of the inverters I1-I3 is further based on the current level of IM. The inverter delay is relatively short even for relatively low values of IM, so that the frequency of oscillation of VAC is relatively high and well above FMIN. The current level of IM is based on the current level of TIN because of the current mirror configuration. When the laser beam 108 is focused on the laser probe area 214 (e.g., any PN junction of any of the inverters I1-I3), then the reflected laser beam 116 is modulated based on the frequency of the ring oscillator 252 and thus VAC, so that the output signal 120 displayed on the display device 122 has a frequency level within a frequency range at or above FMIN, in which the specific frequency level is based on the current level of IIN. In this manner, IIN is converted to an oscillating or alternating signal VAC having a frequency at or above FMIN with a specific frequency based on the current level of IIN, so that the current level of IIN may be measured by the test equipment 124.

Figure 3:
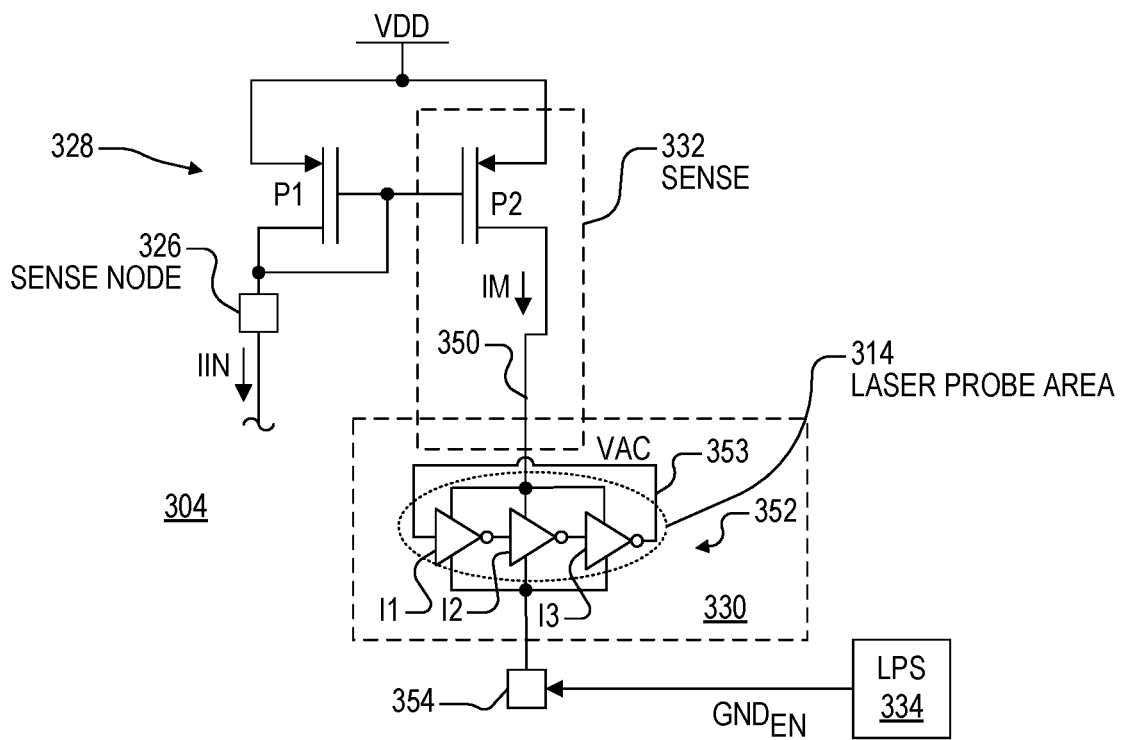
FIG. 3 is a schematic diagram of a device under test implemented according to another embodiment of the present invention also using a ring oscillator for converting a DC or low frequency current into a higher frequency signal at or above FMIN.

FIG. 3 is a schematic diagram of a DUT 304 illustrating the DUT 104 implemented according to another embodiment of the present invention using a ring oscillator 352 for converting a DC or low frequency current into a higher frequency signal at or above FMIN. The DUT 304 is similar to the DUT 204 and includes a similar portion of a functional circuit 328 which further includes a sense node 326 illustrating another embodiment of a small portion of the functional circuit 128 and the sense node 126 of the DUT 104. In a similar manner as with the DUT 204, the sense node 326 is, or is otherwise part of, an electrical conductor through which a current TIN flows when the DUT 304 is powered. Again, the electrical current TIN is a low frequency electrical parameter that is either constant or varies at a relatively low frequency level below FMIN, and it is desired to detect the value of IIN using the LVP test system 102, which can only detect electrical parameters that alternate at a frequency at or above FMIN.

The DUT 304 further includes a sense circuit 332 illustrating an embodiment of the sense circuit 132 for detecting IIN. In this case, the functional circuit 328 develops the IIN current to flow out of a drain terminal of a P-type (or P-channel) MOS (PMOS) transistor P1 as part of a mirror circuit (not shown). P1 is diode-connected having its drain terminal connected to its gate terminal, and P1 further has a source terminal coupled to the supply voltage VDD. The sense circuit 332 includes a PMOS transistor P2, having a gate terminal coupled to the gate and drain terminals of P1, and having a source terminal coupled to VDD. In this manner, P2 is coupled to P1 to form a current mirror configuration in which a mirrored current IM flows out of the drain terminal of P2 having a current level equal to or otherwise proportional to IIN. Additional current branches (not shown) may be included for mirroring IIN into other portions of the functional circuit 328, in which P2 is an added current mirror branch for developing IM. P2 may be implemented to have the same size as P1 so that IM is substantially equal to TIN, or P2 may be sized relative to P1 to adjust the magnitude of IM relative to IIN. In a similar manner as previously described for N1 and N2 of the DUT 204, if P1 is not otherwise provided in the functional circuit 328 forming a branch of the mirror circuit, then the added sense circuit 332 includes P1 and P2 (and any other support devices) to develop the mirror current IM.

The sense circuit 332 further includes an electrical conductor 350, such as a conductive trace or the like, that conveys IM to a converter 330 (implementing the converter 130). The converter 330 is substantially similar to the converter 230, including a ring oscillator 352 configured with three (or any odd number of) similar inverters I1, I2, and I3 coupled in series with a feedback node 353 developing an alternating voltage VAC coupled between its input and output in a similar manner previously described for the ring oscillator 252. Any one of the inverters I1-I3 includes a PN junction serving as a laser probe area 314 implementing the laser probe area 114. Each of the inverters I1-I3 has an upper supply voltage terminal coupled to the electrical conductor 350, and a lower supply voltage terminal coupled to a supply enable 354. The supply enable 354 receives a ground enable signal $GND_{EN}$ from a laser probe support (LPS) circuit 334 implementing an embodiment of the LPS circuit 134. In one embodiment, the supply enable 354 is a node receiving $GND_{EN}$ as the GND voltage from the LPS circuit 334 which provides GND to enable the converter 330. In another embodiment, the supply enable 354 is a switch coupled between GND and the ring oscillator 352, in which the LPS circuit 334 asserts $GND_{EN}$ as a logic signal that closes the switch to couple GND to the converter 330. In either case, $GND_{EN}$ facilitates coupling of GND to the converter 330.

In operation, the LPS circuit 334 may assert $GND_{EN}$ to an appropriate level (e.g., high) to disable or turn off the converter 330. When disabled, the converter 330 does not affect operation of the functional circuit 328. When the LPS circuit 334 pulls $GND_{EN}$ to an appropriate enable level (e.g., low), then the converter 330 is activated and the ring oscillator 352 oscillates VAC at a frequency based on the delay of each of the inverters I1-I3, in which the delay of each of the inverters I1-I3 is further based on the current level of IM. The current level of IM is based on the current level of TIN because of the current mirrored configuration. When the laser beam 108 is focused on the laser probe area 314 (e.g., any PN junction of any of the inverters I1-I3), then the reflected laser beam 116 is modulated based on the frequency of the ring oscillator 352 (and thus VAC), so that the output signal 120 displayed on the display device 122 has a frequency level within a frequency range at or above FMIN, in which the specific frequency level is based on the current level of TIN. In this manner, IIN is converted to an oscillating or alternating signal VAC having a frequency at or above FMIN with a specific frequency based on the current level of IIN, so that the current level of TIN may be measured by the test equipment 124.

It is appreciated that the current mirror configuration of N1 and N2 of the DUT 204 is substantially similar to the current mirror configuration of P1 and P2 of the DUT 304 except that one is N-type while the other is P-type. In either case, a current IIN of the underlying functional circuit (238 or 338) is mirrored to provide a mirrored current IM which is used to activate a ring oscillator (252 or 352) within a corresponding converter (230 or 330) to convert IM into an oscillating signal having a frequency at or above FMIN. Although shown and described for different DUTs 204 and 304, it is appreciated that both configurations may be implemented on the same IC or semiconductor device (e.g., both on DUT 204 or DUT 304).

Figure 4:
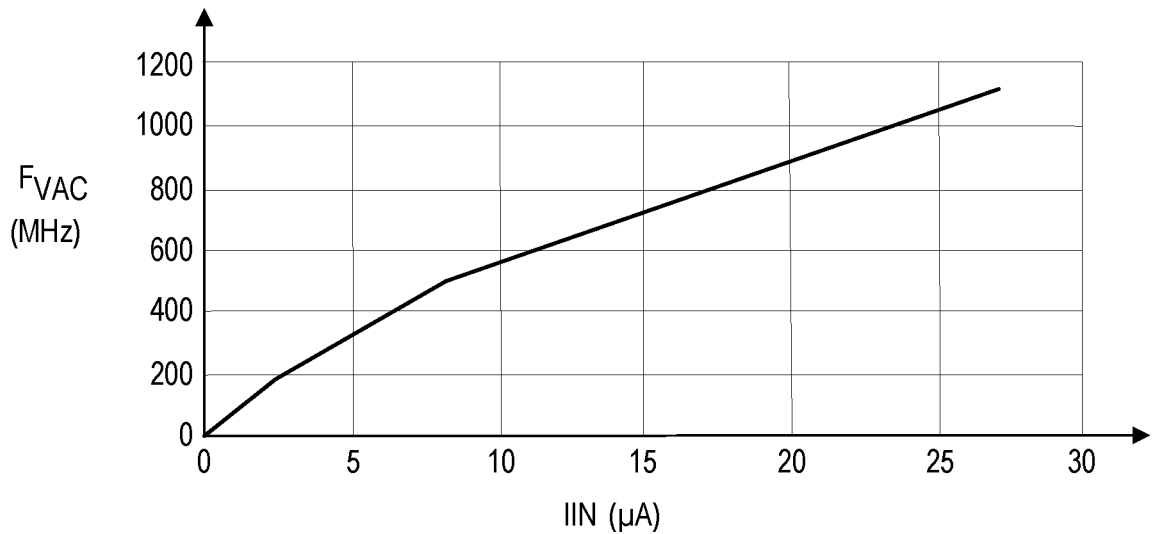
FIG. 4 is a graphic diagram plotting the frequency of the VAC signal versus the current level of the input current for either of the devices under test of FIG. 2 or 3.

FIG. 4 is a graphic diagram plotting the frequency of the VAC signal ($F_{VAC}$) in Megahertz (MHz) versus the current level of TIN microamperes (μA) for either DUT 204 or 304 according to one embodiment. The conversion operation for both DUTs 204 and 304 is substantially the same with only slight variations in numerical values of frequency or current. In either case, the delay of each of the inverters I1-I3 is relatively small so that the frequency of oscillation of VAC may be well above FMIN even with relatively small values of TIN (reflected as the mirrored current IM). The particular current range of IIN or the particular frequency range of $F_{VAC}$ may be different without departing from the spirit and scope of this disclosure. For example, the particular frequency range of $F_{VAC}$ may be significantly less, such as in the kHz range (as long as greater than FMIN), or significantly greater (e.g., in the Gigahertz (GHz) range). Likewise, the particular current range of IIN may be less (e.g., in the nanoampere (nA) range) or more (e.g., in the milliampere (mA) range). In any event, the determined relationship between the $F_{VAC}$ and the corresponding current level of IIN enables measurement of IIN using the LVP test system 102.

Figure 5:
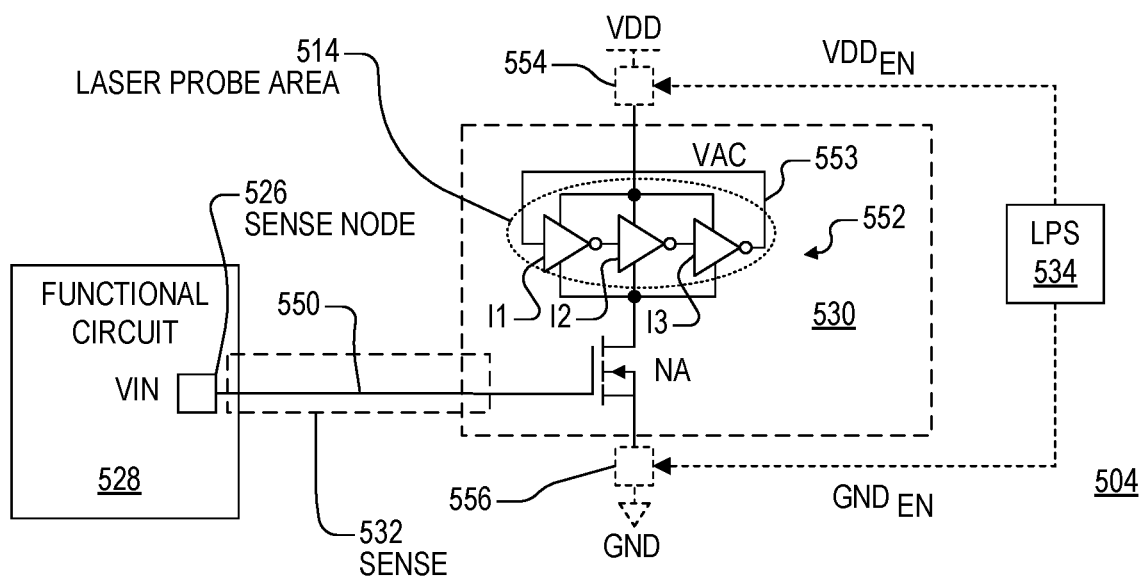
FIG. 5 is a schematic diagram of a device under test implemented according to yet another embodiment of the present invention using a ring oscillator for converting a DC or low frequency voltage into a higher frequency signal at or above FMIN.

FIG. 5 is a schematic diagram of a DUT 504 illustrating the DUT 104 implemented according to yet another embodiment of the present invention using a ring oscillator 552 for converting a DC or low frequency voltage into a higher frequency signal at or above FMIN. The DUT 504 also includes a portion of a functional circuit 528 further including a sense node 526 illustrating another embodiment of a small portion of the functional circuit 128 and the sense node 126 of the DUT 104. In this case, the sense node 526 develops an input voltage VIN when the DUT 504 is powered. The electrical voltage VIN is a low frequency electrical parameter that is either constant or varies at a relatively low frequency level below FMIN, and it is desired to detect the value of VIN using the LVP test system 102, which can only detect electrical parameters that alternate at a frequency at or above FMIN. The DUT 504 further includes a sense circuit 532 for conveying VIN to an input of a converter 530 implementing an embodiment of the converter 130. In this case, the sense circuit 532 may simply be an electrical conductor 550 which is coupled between the sense node 526 and the converter 530.

The converter 530, which is similar to the converter 230, includes the ring oscillator 552 configured with three (or any odd number of) similar inverters I1, I2, and I3 coupled in series with a feedback node 553 coupled between its input and output which develops an alternating voltage VAC in a similar manner previously described for the ring oscillator 252. Any one of the inverters I1-I3 includes a PN junction serving as a laser probe area 514 implementing an embodiment of the laser probe area 114. Each of the inverters I1-I3 has an upper supply voltage terminal which may be coupled to a first supply enable 554. In this case for sensing VIN, each of the inverters I1-I3 has a lower supply voltage terminal coupled to a drain terminal of an NMOS transistor NA, having its source terminal coupled to a second supply enable 556 and a gate terminal coupled to the electrical conductor 550 for receiving VIN. NA is used for converting voltage to current, in which it is understood that other types of transistors are contemplated, such as a field-effect transistor (FET) or a bipolar transistor or the like, or any other suitable voltage to current conversion device or circuit.

The supply enable 554 is shown coupled to VDD and includes an input receiving $VDD_{EN}$ from a laser probe support (LPS) circuit 534 implementing an embodiment of the LPS circuit 134, and the supply enable 556 is shown coupled to GND and includes an input receiving $GND_{EN}$ from the LPS circuit 534. The supply enables 554 and 556, the signals conveying $VDD_{EN}$ and $GND_{EN}$, and the VDD/GND connections are shown using dashed lines representing several different configurations. In a first embodiment, the supply enable 554 is simply a conductor or is not provided in which the upper supply voltage inputs of each of the inverters I1-I3 are coupled directly to VDD and $VDD_{EN}$ is not provided by the LPS circuit 534. In this first case, the supply enable 556 is provided and is either a switch for coupling the converter 530 to GND when $GND_{EN}$ is asserted, or is a conductor in which $GND_{EN}$ itself provides the GND connection. In either case, $GND_{EN}$ facilitates coupling of GND to the converter 530. In a second embodiment, the supply enable 556 is simply a conductor or is not provided in which the source terminal of NA is coupled directly to GND and $GND_{EN}$ is not provided by the LPS circuit 534. In this second case, the supply enable 554 is provided and is either a switch for coupling the converter 530 to VDD when $VDD_{EN}$ is asserted, or is a conductor in which $VDD_{EN}$ itself provides the VDD connection. In either case, $VDD_{EN}$ facilitates coupling of VDD to the converter 530. A third embodiment is possible in which both supply enables 554 and 556 are provided and both enabled or disabled together.

In operation, the LPS circuit 534 may assert either one or both $GND_{EN}$ or $VDD_{EN}$ to an appropriate level to disable or turn off the converter 530. When disabled, the converter 530 does not affect operation of the functional circuit 528. When the LPS circuit 534 asserts $VDD_{EN}$ or $GND_{EN}$ (or both) to an appropriate enable level, then the converter 530 is activated and the ring oscillator 552 oscillates VAC at a frequency based on the voltage level of VIN. The voltage level of VIN controls the drain current of NA which further controls the frequency of oscillation of the ring oscillator 552. It is noted that the size of NA may be selected based on the voltage range of VIN so that the drain current of NA develops at a level similar to the current IM of FIGS. 2 and 3. The ring oscillator 552 oscillates VAC at a frequency based on the delay of each of the inverters I1-I3, in which the delay of each of the inverters I1-I3 is further based on the drain current level of NA which is further based on the voltage level of VIN. When the laser beam 108 is focused on the laser probe area 514 (e.g., any PN junction of any of the inverters I1-I3), then the reflected laser beam 116 is modulated based on the frequency of the ring oscillator 552 (and thus VAC), so that the output signal 120 displayed on the display device 122 has a frequency level within a relatively high frequency range, in which the specific frequency level is based on the voltage level of VIN. In this manner, VIN is converted to an oscillating or alternating signal VAC having a relatively high frequency with a specific frequency based on the voltage level of VIN, so that the voltage level of VIN may be measured by the test equipment 124.

Figure 6:
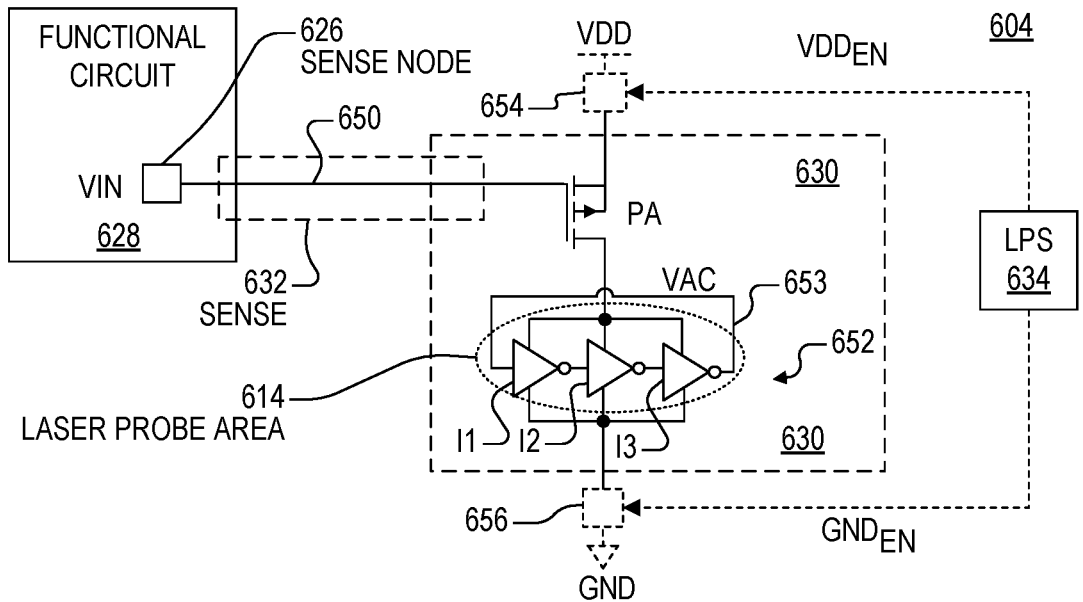
FIG. 6 is a schematic diagram of a device under test implemented according to another embodiment of the present invention also using a ring oscillator for converting a DC or low frequency voltage into a higher frequency signal at or above FMIN.

FIG. 6 is a schematic diagram illustrating the DUT 104 implemented according to an embodiment of the present invention similar to the DUT 504 using a ring oscillator 652, in which the DUT 604 also includes a portion of a functional circuit 628 including a sense node 626 developing an input voltage VIN when the DUT 604 is powered. Again, the electrical voltage VIN is a low frequency electrical parameter that is either constant or varies at a relatively low frequency level below FMIN, and it is desired to detect the value of VIN using the LVP test system 102. The DUT 604 further includes a sense circuit 632 which may simply be an electrical conductor 650 coupled between the sense node 626 and an input of a converter 630 configured in a similar manner as the converter 530. The converter 630 is shown coupled between first and second supply enables 654 and 656 receiving $VDD_{EN}$ and $GND_{EN}$ from an LPS circuit 634 in substantially the same manner as the first and second supply enables 554 and 556 and the LPS circuit 534 described for the DUT 504. Any one of several different configurations and corresponding operations for enabling the converter 630 of the DUT 604 are substantially the same as that described for the converter 530 of the DUT 504. As before, $VDD_{EN}$ facilitates coupling of VDD to the converter 630 if not already coupled, and $GND_{EN}$ facilitates coupling of GND to the converter 630 if not already coupled.

The converter 630 is similar to the converter 530, except that NA is replaced by a PMOS transistor PA having its source terminal coupled to the supply enable 654 (for receiving VDD or any other suitable supply voltage), and its drain terminal coupled to the upper voltage supply terminals of similar inverters I1, I2 and I3 of a similar ring oscillator 652. Similar to NA, in this case PA is used for converting voltage to current, in which it is understood that other types of transistors are contemplated, such as a FET or a bipolar transistor or the like, or any other suitable voltage to current conversion device or circuit. The lower voltage supply terminals of I1-I3 are coupled to the supply enable 656 and the inverters I1-I3 are coupled together in a ring configuration having a feedback node 653 developing VAC in the same manner previously described. Operation of the converter 630 is substantially the same as the converter 530, such that when the converter 630 is enabled by the LPS circuit 634, the voltage level of VIN determines the drain current through PA which in turns determines the specific frequency of oscillation of the ring oscillator 652. The ring oscillator 652 oscillates VAC at a frequency based on the delay of each of the inverters I1-I3, in which the delay of each of the inverters I1-I3 is further based on the drain current level of PA which is further based on the voltage level of VIN. Thus, when the laser beam 108 is focused on the laser probe area 614 (e.g., any PN junction of any of the inverters I1-I3), then the reflected laser beam 116 is modulated based on the frequency of the ring oscillator 652 (and thus VAC), so that the output signal 120 displayed on the display device 122 has a frequency level at or above FMIN in which the specific frequency level is based on the voltage level of VIN. In this manner, VIN is converted to an oscillating or alternating signal VAC having a relatively high frequency with a specific frequency based on the voltage level of VIN, so that the voltage level of VIN may be measured by the test equipment 124.

Figure 7:
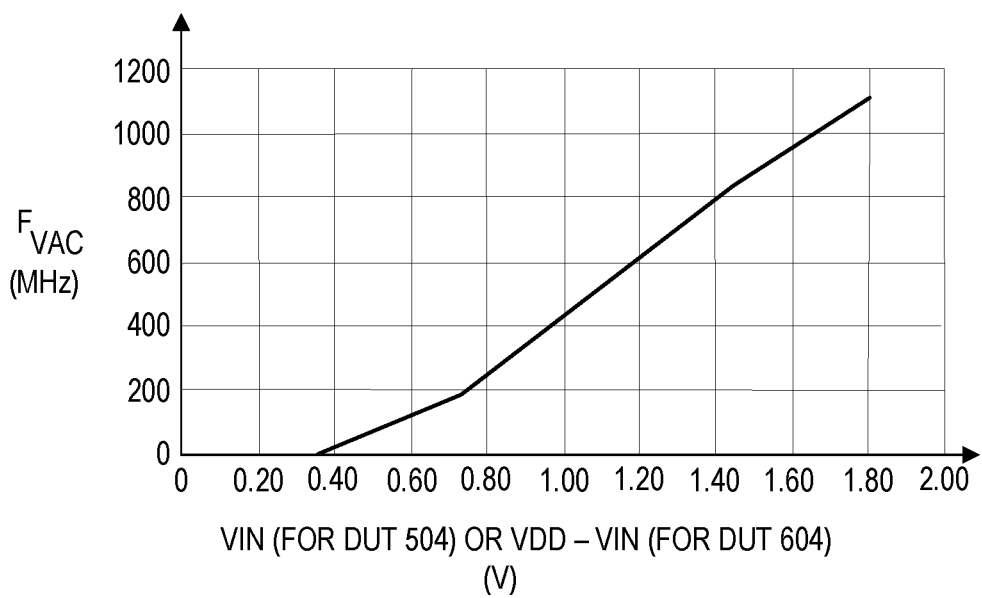
FIG. 7 is a graphic diagram plotting the frequency of the VAC signal versus the voltage level of the input voltage for either of the devices under test of FIG. 5 or 6.

FIG. 7 is a graphic diagram plotting the frequency of VAC ($F_{VAC}$) in MHz versus the voltage level of VIN in Volts (V) (for DUT 504) or the voltage level of VDD-VIN (for DUT 604) illustrating operation of either of the DUTs 504 or 604. The conversion operation for both DUTs 504 and 604 is substantially the same with only slight variations in numerical values of frequency or voltage. Similar to that described for the DUT 504, $F_{VAC}$ may have a frequency range well below the MHz range (as long as at or above FMIN) or well above the MHz range in different configurations, and VIN may also have a different voltage range. For either DUT 504 or 604, the delay of each of the inverters I1-I3 is relatively small so that the frequency of oscillation of VAC may be significantly larger than FMIN even with relatively small values of VIN. In the illustrated configurations, the voltage level on the order of 1V or so results in a frequency level in the Megahertz range, which is well above FMIN. Also, the known relationship between the voltage level of VIN and $F_{VAC}$ enables measurement of VIN using the LVP test system 102. It is noted that the same DUT may include any combination of the converters 230, 330, 530, or 630 for measuring corresponding current or voltage levels.

Figure 8:
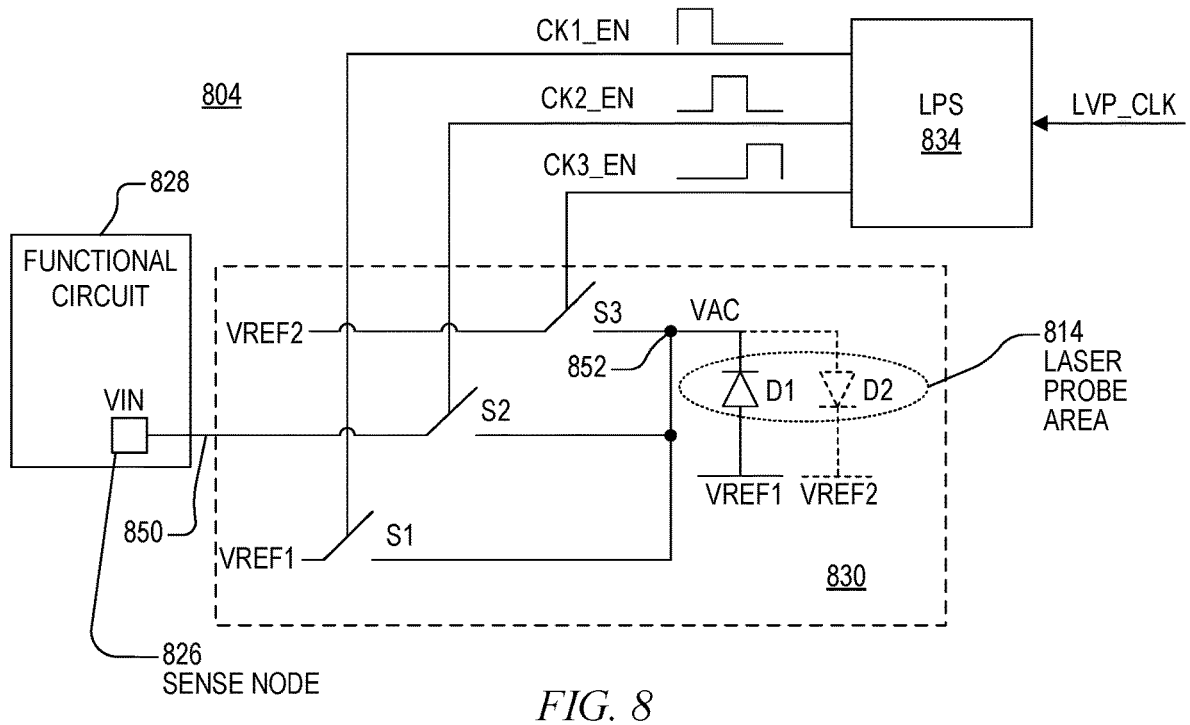
FIG. 8 is a schematic diagram of a device under test implemented according one embodiment of the present invention including a converter receiving one or more enable signals based on a clock signal LVP_CLK having a suitable frequency at or above FMIN.

FIG. 8 is a schematic diagram of a DUT 804 illustrating an embodiment of the DUT 104 implemented according one embodiment of the present invention including a converter 830 receiving one or more enable signals based on a clock signal LVP_CLK having a suitable frequency at or above FMIN. The DUT 804 includes a portion of a functional circuit 828 which further includes a sense node 826 in similar manner as in other configurations, in which the sense node 826 develops VIN. Again, the electrical voltage VIN is a low frequency electrical parameter that is either constant or varies at a relatively low frequency level below FMIN, and it is desired to detect the value of VIN using the LVP test system 102. A sense circuit including an electrical conductor 850 conveys VIN to an input of the converter 830. The converter 830 includes a diode D1 having an anode coupled to a first, lower reference voltage VREF1 and a cathode coupled to a detect node 852 developing VAC. The diode D1 incorporates a PN junction forming a laser probe area 814 implementing an embodiment of the laser probe area 114. In an alternative embodiment, the same diode or a similar diode D2 (shown using dotted lines) has its anode coupled to the detect node 852 and its cathode coupled to a second, higher reference voltage VREF2 providing the same or similar laser probe area 814. Operation using the diode D2 is similar to that of diode D1 and is not further described. Alternative devices other than diodes are contemplated that may serve as the laser probe area 814. The detect node 852 develops an alternating voltage VAC at a frequency at or above FMIN based on the voltage level of VIN as further described herein.

A first switch S1 has switched terminals coupled between VREF1 and the detect node 852 and has a control input receiving a first clock enable signal CK1_EN, a second switch S2 has switched terminals coupled between conductor 850 (receiving VIN) and the detect node 852 and has a control input receiving a second clock enable signal CK2_EN, and a third switch S3 has switched terminals coupled between VREF2 and the detect node 852 and has a control input receiving a third clock enable signal CK3_EN. The voltage levels of VREF1 and VREF2 are selected such that the range of VIN is between VREF1 and VREF2, or VREF1≤VIN≤VREF2. It is noted that either one or both of the known reference voltages VREF1 and VREF2 may be a supply voltage. For example, VREF1 may be GND or VREF2 may be VDD. Each of the switches S1-S3 are opened when its corresponding clock enable signal is asserted at a first logic level (e.g., low) and are closed when its corresponding clock enable signal is asserted at a second logic level (e.g., high). The DUT 804 includes an LPS circuit 834 implementing an embodiment of the LPS circuit 134. The LPS circuit 834 receives the clock signal LVP_CLK which is used to develop the clock enable signals CK1_EN, CK2_EN, and CK3_EN. LVP_CLK may be developed on the DUT 804 or may be externally provided, such as from the test equipment 124.

The LPS circuit 834 may enable or disable the converter 830 using the clock enable signals CK1_EN, CK2_EN, and CK3_EN. In order to disable the converter 830, the LPS circuit 834 asserts the clock enable signals at a constant logic level to keep the switches S1-S2 opened. In an alternative embodiment, one or both supply voltages, such as either GND or VDD or both, may also be switched by the LPS circuit 834 in a similar manner previously described, such as using a corresponding supply enable or the like receiving a supply voltage or an enable signal.

Figure 9:
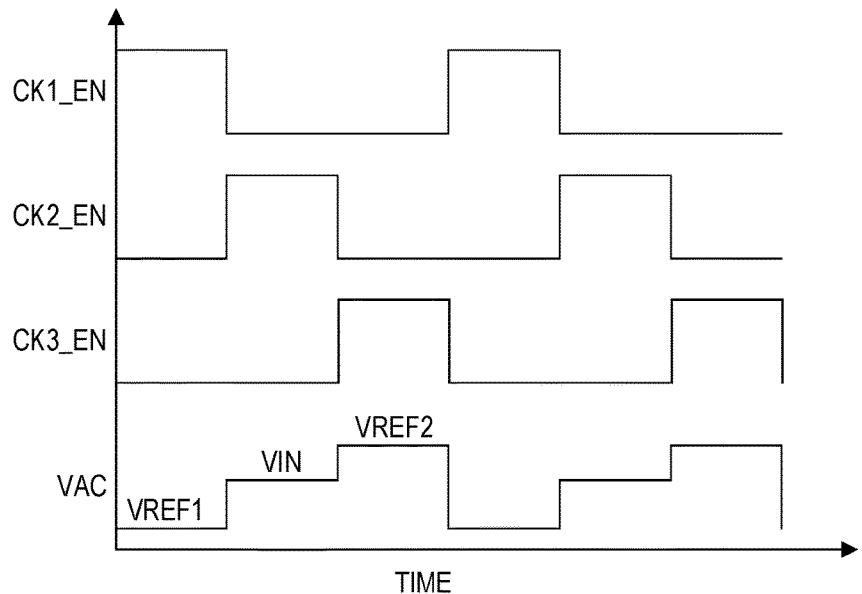
FIG. 9 is a timing diagram plotting the clock enable signals and the sensed alternating voltage signal VAC versus time when the device under test of FIG. 8 is powered and its converter is enabled according to one embodiment.

FIG. 9 is a timing diagram plotting the clock enable signals CK1_EN, CK2_EN, CK3_EN and the sensed alternating voltage signal VAC versus time when the DUT 804 is powered and the converter 830 is enabled according to one embodiment using the diode D1. The clock enable signals CK1_EN, CK2_EN, and CK3_EN are each asserted high in a cyclical manner for each of consecutive cycles. In the illustrated configuration, only one of the clock enable signals is asserted at a time, although alternative configurations are contemplated using different sequencing and switching frequencies. In the illustrated configuration, CK1_EN is asserted first while CK2_EN and CK3_EN remain low, then CK2_EN is asserted next while CK1_EN and CK3_EN remain low, and then CK3_EN is asserted last while CK1_EN and CK2_EN remain low, and the process is repeated in subsequent cycles. When CK1_EN is asserted high, S1 closes pulling VAC to VREF1. When CK2_EN is asserted high, S2 closes pulling VAC to the voltage level of VIN. When CK3_EN is asserted high, S3 closes pulling VAC to the voltage level of VREF2. In this manner, VAC has a stair-step waveform having at least one voltage step related to the voltage of VIN, and at least one voltage step related to a known voltage level, such as VREF1 or VREF2.

The frequencies of the clock enable signals CK1_EN, CK2_EN, and CK3_EN may be substantially equal to each other and may be based on the frequency of LVP_CLK operating at a frequency level above FMIN, so that the detect node 852 alternates VAC at or above FMIN. In this manner, when the laser beam 108 is focused on the laser probe area 814, then the reflected laser beam 116 is modulated based on the frequency of VAC so that the output signal 120 displayed on the display device 122 follows VAC. The voltage levels of VREF1 and VREF2 are both known, so that the voltage level of VIN may be derived based on its voltage level relative to VREF1 and VREF2. In this manner, VIN is converted to an oscillating or alternating signal VAC having a frequency based on the frequency of LVP_CLK, and the voltage level of VIN may be derived by the test equipment 124 relative to the known voltage levels of VREF1 and VREF2. In the case in which diode D1 is replaced by the diode D2, the waveform of VAC is similar so that the voltage level of VIN is readily determined.

FIG. 10 is a schematic and block diagram of a DUT 1004 implemented according to another embodiment in which a capacitor C is repeatedly charged and discharged to convert a DC or low frequency current signal IIN into an alternating voltage signal VAC on node 1033 having a frequency at or above FMIN for laser detection. The functional circuit (not shown) on the DUT 1004 includes a sense circuit 1032 depicted as a current sink referenced to GND developing the current IIN. The electrical current IIN is a low frequency electrical parameter that is either constant or alternates at a relatively low frequency level below FMIN, in which it is desired to detect the value of IIN using the LVP test system 102. The sense circuit 1032 may be implemented as a current mirror branch in a similar manner as shown and described in FIG. 2 in which the current IIN shown developed by the current sink may actually be a mirrored current signal from the functional circuit. An electrical conductor 1050 conveys the current IIN to a converter 1030 in a similar manner previously described, in which the conductor 1050 is coupled to the node 1033 in the illustrated embodiment. The converter 1030 includes the capacitor C and a PMOS transistor (or other suitable transistor type, such as a FET or bipolar transistor or the like) PB, having its source terminal coupled to one end and its drain terminal coupled to the other end of the capacitor C. The source terminal of PB is also shown coupled to VDD (or other suitable reference voltage level), and the drain terminal of PB is coupled to node 1033 developing VAC. An LPS circuit 1034 provides a clock enable signal CLK_EN based on a clock signal LVP_CLK, which may be developed on the DUT 1004 or externally provided. The capacitor C or the transistor PB may serve as an embodiment of the laser probe area 1014.

Although the converter 1030 is shown connected to VDD, in an alternative embodiment VDD may be a switched connection controlled by the LPS circuit 1034 in a similar manner previously described to ensure that the converter 1030 does not have any electrical effect on the underlying functional circuit.

FIG. 11 is a graphic diagram plotting CLK_EN and VAC versus time for the DUT 1004 when the converter 1030 is enabled in which VAC ramps down at a rate based on IIN. In the illustrated embodiment, the LPS circuit 1034 may hold CLK_EN high keeping PB off to disable the converter 1030. The LPS circuit 1030 toggles CLK_EN based on LVP_CLK to enable the converter 1030, in which CLK_EN has a frequency at or above FMIN for detection by the LVP test system 102. When CLK_EN goes low, PB turns on and discharges the capacitor C so that VAC is pulled high to VDD. When CLK_EN goes high, PB is turned off and the capacitor C charges at a rate based on the current level of IIN. As the capacitor C charges, VAC ramps down at a rate based on the current level of IIN. Thus, VAC decreases more quickly for higher values of IIN and decreases more slowly for lower values of IIN. The value of IIN may be determined based on the slope of VAC when CLK_EN goes low. Operation repeats in this manner for successive cycles of CLK_EN.

FIG. 12 is a schematic and block diagram of a DUT 1204 implemented according to another embodiment similar to the DUT 1004 in which a capacitor C is repeatedly charged and discharged to convert a DC or low frequency current signal IIN into an alternating signal VAC on a node 1233 having a frequency at or above FMIN for laser detection. The functional circuit (not shown) on the DUT 1204 includes a sense circuit 1232 depicted as a current source referenced to VDD developing the current IIN in a similar manner as the sense circuit 1032 of FIG. 10. Again, the electrical current IIN is a low frequency electrical parameter that is either constant or alternates at a relatively low frequency level below FMIN, in which it is desired to detect the value of IIN using the LVP test system 102. Also, IIN may be represented as a mirrored current signal. An electrical conductor 1250 conveys the current IIN to the node 1233 of a converter 1230 in a similar manner previously described. The converter 1230 includes the capacitor C and an NMOS transistor (or other suitable transistor type, such as a FET or bipolar transistor or the like) NB, having its source terminal coupled to one end and its drain terminal coupled to the other end of the capacitor C. The source terminal of NB is also shown coupled to GND, and the drain terminal of NB is coupled to node 1233 which conveys IIN and which also develops the voltage VAC. An LPS circuit 1234 provides a clock enable signal CLK_EN based on a clock signal LVP_CLK, which may be developed on the DUT 1204 or externally provided. The capacitor C or the transistor NB serve as the laser probe area 1214.

Although the converter 1230 is shown connected to GND, in an alternative embodiment VDD may be a switched connection controlled by the LPS circuit 1234 in a similar manner previously described to ensure that the converter 1230 does not have any electrical effect on the underlying function circuit.

FIG. 13 is a graphic diagram plotting CLK_EN and VAC versus time for the DUT 1204 when the converter 1230 is enabled in which VAC ramps up at a rate based on IIN. In the illustrated embodiment, the LPS circuit 1234 may hold CLK_EN low keeping NB off to disable the converter 1230. The LPS circuit 1230 toggles CLK_EN based on LVP_CLK to enable the converter 1230, in which CLK_EN has a frequency at or above FMIN for detection by the LVP test system 102. When CLK_EN goes high, NB turns on and discharges the capacitor C so that VAC is pulled low to GND. When CLK_EN goes low, NB is turned off and the capacitor C charges at a rate based on the current level of IIN. As the capacitor C charges, VAC ramps up at a rate based on IIN. Thus, VAC increases more quickly for higher values of IIN and increases more slowly for lower values of IIN. The value of IIN may be determined based on the slope of VAC when CLK_EN goes low. Operation repeats in this manner for successive cycles of CLK_EN.

FIG. 14 is a schematic and block diagram of a DUT 1804 implemented according to another embodiment similar to the DUT 1004 in which a capacitor C is repeatedly charged and discharged to convert a DC or low frequency voltage signal VIN into an alternating signal having a frequency at or above FMIN for laser detection. The functional circuit (not shown) on the DUT 1404 includes a sense node 1426 and an electrical conductor 1450 conveys the voltage VIN to an input of a converter 1430 in a similar manner previously described. The electrical voltage VIN is a low frequency electrical parameter that is either constant or alternates at a relatively low frequency level below FMIN, in which it is desired to detect the value of VIN using the LVP test system 102. The converter 1430 includes the capacitor C, a PMOS transistor (or other suitable transistor type, such as a FET or bipolar transistor or the like) PC, and an NMOS transistor (or other suitable transistor type, such as a FET or bipolar transistor or the like) NC. NC has its source terminal coupled to GND, its gate terminal coupled to the electrical conductor 1450 for receiving VIN, and its drain terminal coupled to one end of the capacitor C at a node 1431 developing VAC. PC has its drain terminal coupled to the node 1431, its source terminal coupled to the other end of the capacitor C and to VDD (or other suitable reference or supply voltage), and its gate terminal receiving a clock enable signal CLK_EN. An LPS circuit 1434 provides CLK_EN based on a clock signal LVP_CLK, which may be developed on the DUT 1404 or externally provided. The capacitor C or the transistor PC serves as the laser probe area 1414.

Although the converter 1430 is shown connected to both VDD and GND, in an alternative embodiment, one or both VDD and GND may be a switched connection controlled by the LPS circuit 1434 in a similar manner previously described to ensure that the converter 1430 does not have any electrical effect on the underlying function circuit.

FIG. 15 is a graphic diagram plotting CLK_EN and VAC versus time for the DUT 1404 when the converter 1430 is enabled in which VAC ramps down at a rate based on input voltage VIN. In the illustrated embodiment, the LPS circuit 1434 may hold CLK_EN high keeping PC off to disable the converter 1430. The LPS circuit 1430 toggles CLK_EN based on LVP_CLK to enable the converter 1430, in which CLK_EN has a frequency at or above FMIN for detection by the LVP test system 102. When CLK_EN goes low, PC turns on and discharges the capacitor C so that VAC is pulled high to VDD. When CLK_EN goes high, PC is turned off and the capacitor C charges at a rate based on the voltage level of VIN (which controls the drain current of QC). As the capacitor C charges, VAC decreases at a rate based on VIN. Thus, VAC decreases more quickly for higher values of VIN and decreases more slowly for lower values of VIN. The value of VIN may be determined based on the slope of VAC when CLK_EN goes low. Operation repeats in this manner for successive cycles of CLK_EN.

FIG. 16 is a schematic and block diagram of a DUT 1604 implemented according to another embodiment similar to the DUT 1204 in which a capacitor C is repeatedly charged and discharged to convert a DC or low frequency voltage signal VIN into an alternative signal having a frequency at or above FMIN for laser detection. The functional circuit (not shown) on the DUT 1604 includes a sense node 1626 and an electrical conductor 1650 conveys the voltage VIN to a converter 1630 in a similar manner previously described. The electrical voltage VIN is a low frequency electrical parameter that is either constant or alternates at a relatively low frequency level below FMIN, in which it is desired to detect the value of VIN using the LVP test system 102. The converter 1630 includes the capacitor C, a PMOS transistor (or other suitable transistor type, such as a FET or bipolar transistor or the like) PD, and an NMOS transistor (or other suitable transistor type, such as a FET or bipolar transistor or the like) ND. PD has its source terminal coupled to VDD (or other suitable supply or reference voltage), its gate terminal coupled to the electrical conductor 1650 for receiving VIN, and its drain terminal coupled to one end of the capacitor C at a node 1631 developing VAC. ND has its drain terminal coupled to the node 1631, its source terminal coupled to the other end of the capacitor C and to GND, and its gate terminal receiving a clock enable signal CLK_EN. An LPS circuit 1634 provides CLK_EN based on a clock signal LVP_CLK, which may be developed on the DUT 1604 or externally provided. The capacitor C or the transistor ND serve as the laser probe area 1614.

Although the converter 1630 is shown connected to both VDD and GND, in an alternative embodiment, one or both VDD and GND may be a switched connection controlled by the LPS circuit 1634 in a similar manner previously described to ensure that the converter 1630 does not have any electrical effect on the underlying function circuit.

FIG. 17 is a graphic diagram plotting CLK_EN and VAC versus time for the DUT 1604 when the converter 1630 is enabled in which VAC ramps up at a rate based on VIN. In the illustrated embodiment, the LPS circuit 1634 may hold CLK_EN low keeping ND off to disable the converter 1630. The LPS circuit 1630 toggles CLK_EN based on LVP_CLK to enable the converter 1630, in which CLK_EN has a frequency at or above FMIN for detection by the LVP test system 102. When CLK_EN goes high, ND turns on and shorts the capacitor C so that VAC is pulled high to GND. When CLK_EN goes low, ND is turned off and the capacitor C charges at a rate based on the voltage level of VIN (which controls the drain current of PD). As the capacitor C charges, VAC increases at a rate based on VIN. Thus, VAC increases more quickly for higher values of VIN and increases more slowly for lower values of VIN. The value of VIN may be determined based on the slope of VAC when CLK_EN goes low. Operation repeats in this manner for successive cycles of CLK_EN.

Figure 18:
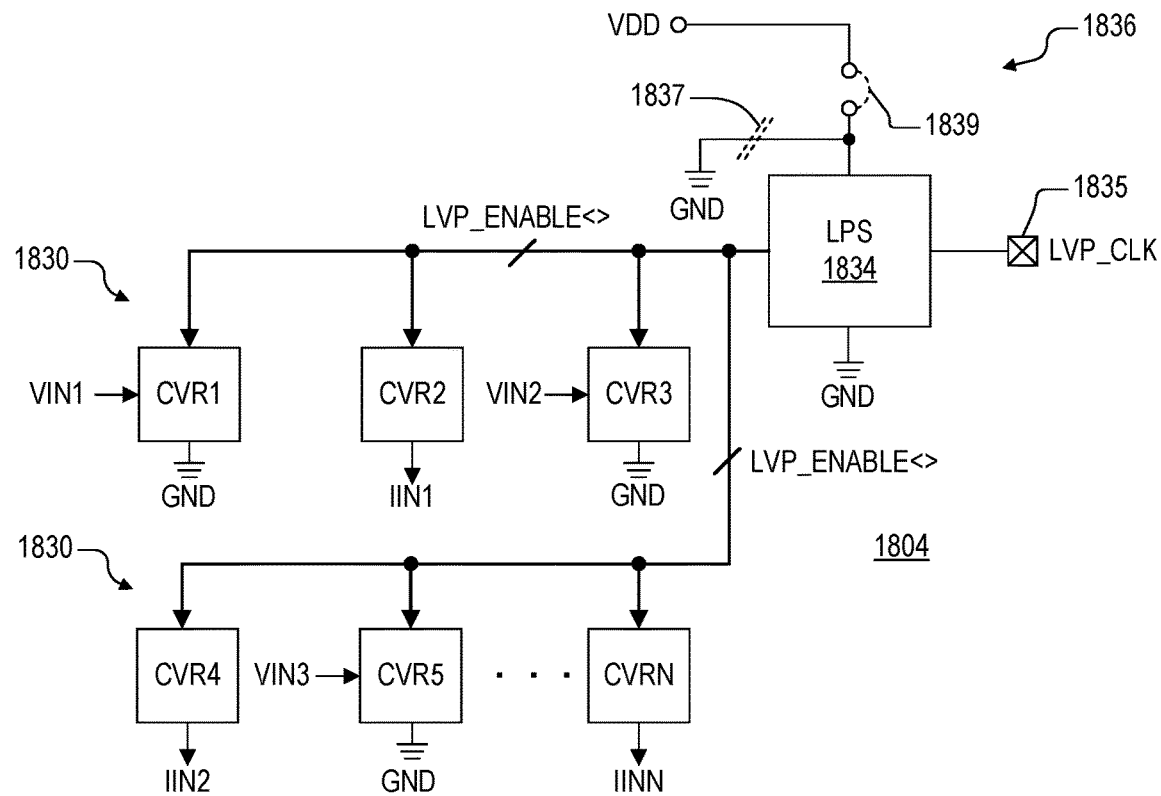
FIG. 18 is a block diagram of a device under test implemented according to one embodiment including multiple converters referenced to GND for converting any number N of voltage or current values of an underlying functional circuit using circuit modification for enable or disable.

FIG. 18 is a block diagram of a DUT 1804 implemented according to one embodiment including multiple converters 1830 referenced to GND, individually shown as CVR1, CVR2, CVR3, CVR4, CVR5, . . . , CVRN, for converting any number N of voltage or current values (e.g., VIN1, VIN2, VIN3, . . . , IIN1, IIN3, IIN3, etc.) of an underlying functional circuit (not shown) of the DUT 1804. These voltage or current values VINx, IINx are low frequency electrical parameters that are either constant or that alternate at relatively low frequencies below FMIN, in which it is desired to detect the values of either VINx or IINx of VIN using the LVP test system 102. Each converter 1830 may be configured according applicable ones of the converters previously described, such as the converters 230, 530, 630, 830, 1030, 1130, 1430, 1630, etc. The DUT 1804 includes an LPS circuit 1834 referenced to GND for supporting and enabling one or more of the converters 1830. The DUT 1804 may include an input/output (I/O) pad or pin 1835 for receiving and providing an external clock signal LVP_CLK to the LPS circuit 1834. The LPS circuit 1834 provides the corresponding ones of the enable signals LVP_ENABLE< > to each of the converters 1830 in a similar manner previously described, such as any combination of supply voltages (GND, VDD, etc.), clock enable signals, logic enable signals, etc.

The DUT 1804 further includes an LVP enable circuit 1836 as a more specific embodiment of the LVP enable circuit 136. The LPS circuit 1834 initially has both its upper and lower supply voltage terminals coupled to GND so that it is initially disabled, which further disables each of the converters 1830. A circuit edit 1837 may be made to cut the GND connection from the upper supply voltage terminal of the LPS circuit 1834, and another circuit edit 1839 may be made to connect the upper supply voltage terminal of the LPS circuit 1834 to VDD to enable the LPS circuit 1834.

The circuits edits 1837 and 1839 may be made in any suitable manner, such as using a Focused Ion Beam (FIB) apparatus or the like. Once enabled, the DUT 1804 may be powered up and operated in a selected normal operating mode or a selected test mode and used as the DUT 104 for measuring by the LVP test system 102. In this manner, the laser beam 108 may be focused on any one of the converters 1830 (CVR1, CVR2, CVR3, CVR4, CVR5, ..., CVRN) for detecting and measuring the voltage or current values (e.g., VIN1, VIN2, VIN3, ..., IIN1, IIN3, IIN3, etc.) of the underlying functional circuit of the DUT 1804.

Figure 19:
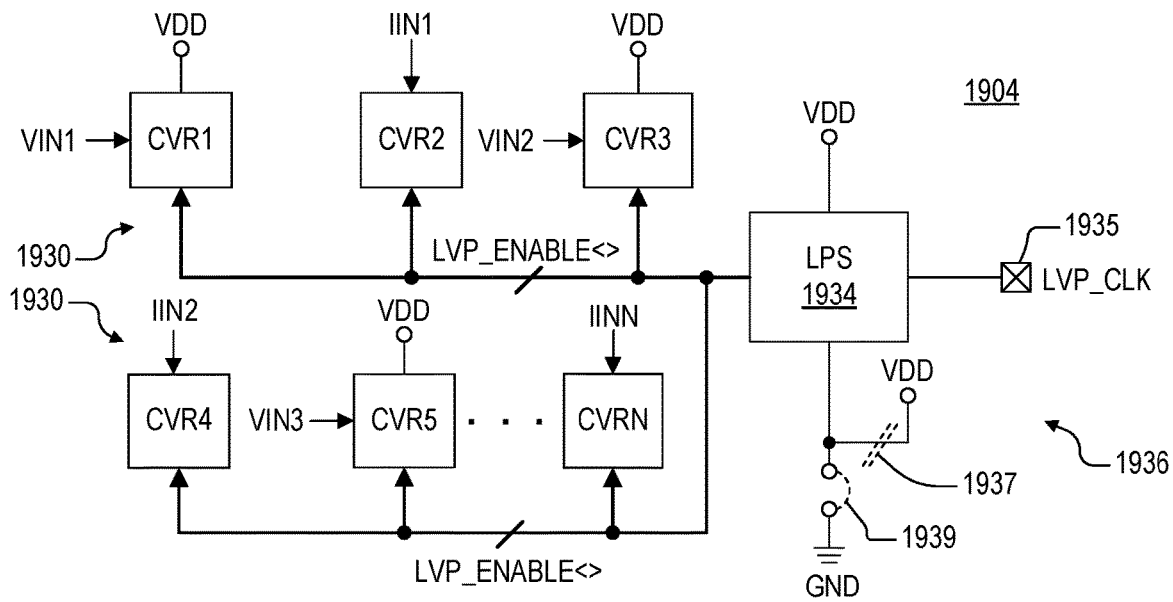
FIG. 19 is a block diagram of a device under test implemented according to another embodiment including multiple converters referenced to a supply voltage VDD for converting any number N of voltage or current values of an underlying functional circuit using circuit modification for enable or disable.

FIG. 19 is a block diagram of a DUT 1904 implemented according to another embodiment including multiple converters 1930 referenced to VDD, individually shown as CVR1, CVR2, CVR3, CVR4, CVR5, ..., CVRN, for converting any number N of voltage or current values (e.g., VIN1, VIN2, VIN3, ..., IIN1, IIN3, IIN3, etc.) of an underlying functional circuit of the DUT 1904. As with the DUT 1804, these voltage or current values VINx, IINx are low frequency electrical parameters that are either constant or that alternate at relatively low frequencies below FMIN, in which it is desired to detect the values of either VINx or IINx of VIN using the LVP test system 102. Each converter 1930 may be configured according applicable ones of the converters previously described, such as the converters 330, 530, 630, 830, 1030, 1130, 1330, 1430, 1630, etc. The DUT 1904 includes an LPS circuit 1934 referenced to VDD for supporting and enabling one or more of the converters 1930. The DUT 1904 may include an I/O pad or pin 1935 for receiving and providing an external clock signal LVP_CLK to the LPS circuit 1934. The LPS circuit 1934 provides the corresponding ones of enable signals LVP_ENABLE<> to each of the converters 1930 in a similar manner previously described, such as any combination of supply voltages (GND, VDD, etc.), clock enable signals, logic enable signals, etc.

The DUT 1904 further includes an LVP enable circuit 1936 as a more specific embodiment of the LVP enable circuit 136. The LPS circuit 1934 initially has both its upper and lower supply voltage terminals coupled to VDD so that it is initially disabled, which further disables each of the converters 1930. A circuit edit 1937 may be made to cut the VDD connection from the lower supply voltage terminal of the LPS circuit 1934, and another circuit edit 1939 may be made to connect the upper supply voltage terminal of the LPS circuit 1934 to GND to enable the LPS circuit 1934. The circuits edits 1937 and 1939 may be made in any suitable manner, such as using an FIB apparatus or the like. Once enabled, the DUT 1904 may be powered up and operated in a selected normal operating mode or a selected test mode and used as the DUT 104 for testing by the LVP test system 102. In this manner, the laser beam 108 may be focused on any one of the converters 1930 (CVR1, CVR2, CVR3, CVR4, CVR5, ..., CVRN) for detecting and measuring the voltage or current values (e.g., VIN1, VIN2, VIN3, ..., IIN1, IIN3, IIN3, etc.) of the underlying functional circuit of the DUT 1904.

Figure 20:
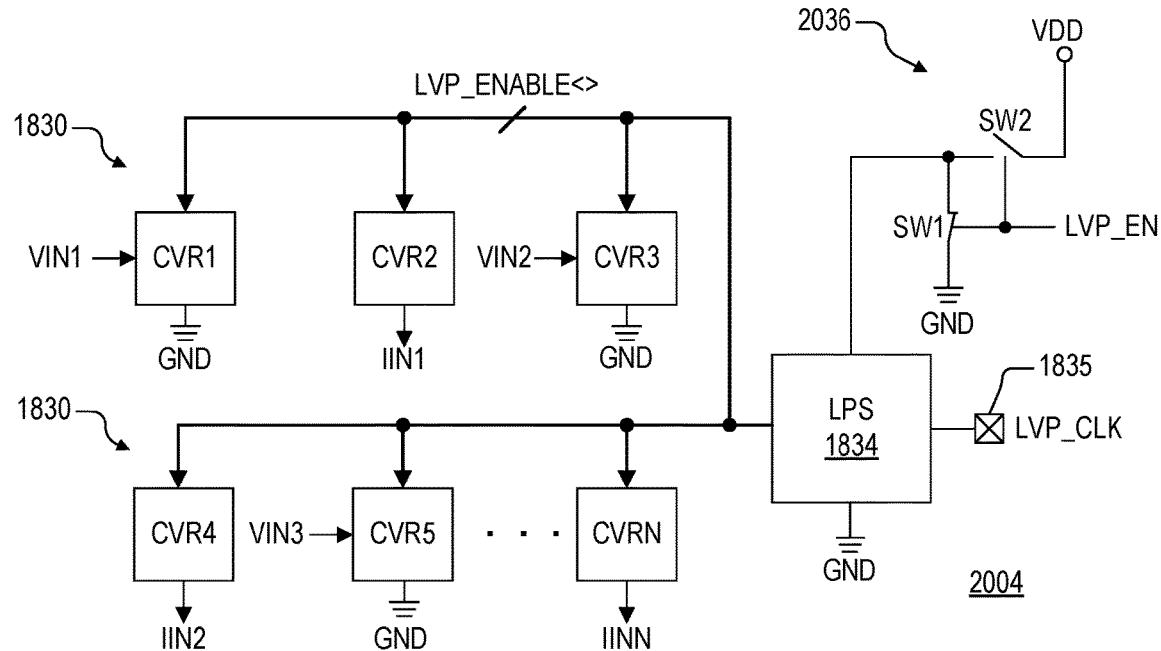
FIG. 20 is a block diagram of a device under test implemented similar to FIG. 18 except using controlled switches for enable or disable.

FIG. 20 is a block diagram of a DUT 2004 implemented according to an embodiment similar to the DUT 1804 in which similar components assume identical reference numerals. The DUT 2004 includes the converters 1830 (CVR1, CVR2, CVR3, CVR4, CVR5, ..., CVRN) referenced to GND for converting any number N of voltage or current values (e.g., VIN1, VIN2, VIN3, ..., IIN1, IIN3, IIN3, etc.) of the underlying functional circuit of the DUT 2004, and also includes the LPS circuit 1834 referenced to GND for supporting and enabling one or more of the converters 1830 via the corresponding enable signals LVP_ENABLE<>. Also, the DUT 2004 may include the pin 1835 for receiving and providing LVP_CLK to the LPS circuit 1834.

The LVP enable circuit 1836, however, is replaced by an LVP enable circuit 2036 which is a different embodiment of the of the LVP enable circuit 136. The LVP enable circuit 2036 includes a pair of switches SW1 and SW2 controlled by an LVP enable signal LVP_EN. SW1 is normally closed and SW2 is normally open. The lower supply voltage terminal of the LPS circuit 1834 is connected to GND in similar manner as for the DUT 1804. The upper supply voltage terminal of the LPS circuit 1834, however, is instead coupled to one switched terminal of each of the switches SW1 and SW2. The other switched terminal of SW2 is connected to VDD and the other switched terminal of SW1 is connected to GND. The switches SW1 and SW2 both have a control terminal receiving LVP_EN. LVP_EN may either be developed by a functional or test circuit (not shown) located on the DUT 2004 or may be externally provided, such as by the test equipment 124 or the like.

In operation, when LVP_EN is asserted to a logic level such that SW1 couples the upper supply voltage terminal of the LPS circuit 1834 to GND, the LPS circuit 1834 and each of the converters 1830 are disabled. When LVP_EN is asserted to a different or opposite logic level such that SW2 enables the LPS circuit 1834, its upper supply voltage terminal is coupled to VDD and the LPS circuit 1834 may then enable any one or more of the converters 1830 to enable the LVP test system 102 to detect and measure constant or low frequency electrical parameters of the DUT 2004.

Figure 21:
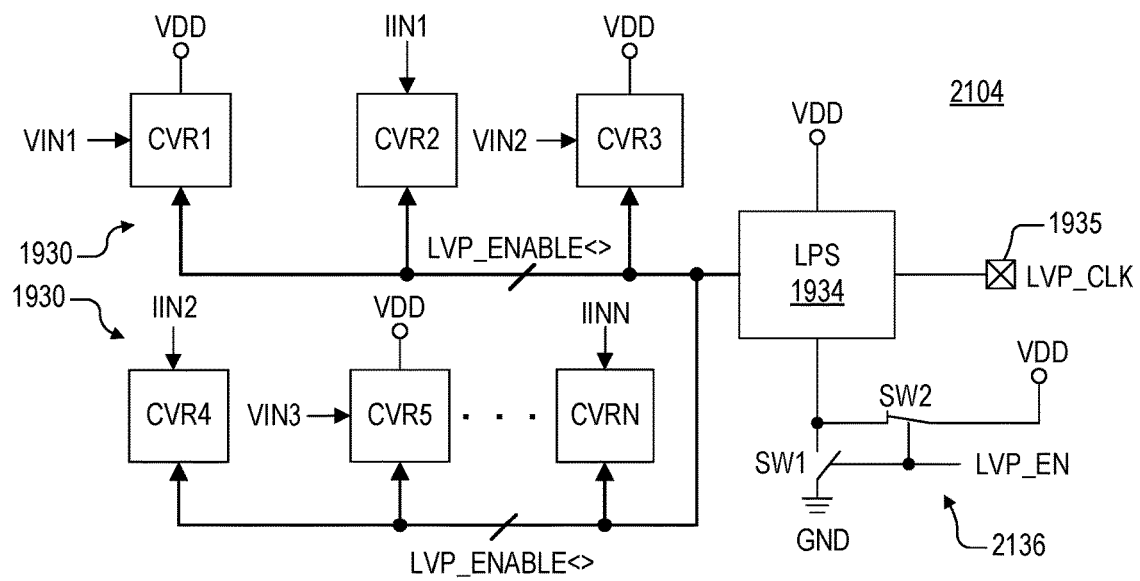
FIG. 21 is a block diagram of a device under test implemented similar to FIG. 19 except using controlled switches for enable or disable.

FIG. 21 is a block diagram of a DUT 2104 implemented according to an embodiment similar to the DUT 1904 in which similar components assume identical reference numerals. The DUT 2104 includes the converters 1930 (CVR1-CVRN) referenced to VDD for converting any number N of voltage or current values (e.g., VIN1, VIN2, VIN3, IIN1, IIN3, IIN3, etc.) of the underlying functional circuit of the DUT 2104, and also includes the LPS circuit 1934 referenced to VDD for supporting and enabling one or more of the converters 1930 via the corresponding enable signals LVP_ENABLE<>. Also, the DUT 2104 may include the pin 1935 for receiving and providing LVP_CLK to the LPS circuit 1934.

The LVP enable circuit 1936, however, is replaced by an LVP enable circuit 2136 which is a different embodiment of the of the LVP enable circuit 136. The LVP enable circuit 2136 includes a pair of switches SW1 and SW2 controlled by an LVP enable signal LVP_EN. SW1 is normally open and SW2 is normally closed. The upper supply voltage terminal of the LPS circuit 1934 is connected to VDD in similar manner as for the DUT 1904. The lower supply voltage terminal of the LPS circuit 1934, however, is instead coupled to one switched terminal of each of the switches SW1 and SW2. The other switched terminal of SW2 is connected to VDD and the other switched terminal of SW1 is connected to GND. The switches SW1 and SW2 both have a control terminal receiving LVP_EN. LVP_EN may either be developed by functional or test circuit (not shown) located on the DUT 2004 or may be externally provided, such as by the test equipment 124 or the like.

In operation, when LVP_EN is asserted to a logic level such that SW2 couples the lower supply voltage terminal of the LPS circuit 1934 to VDD, the LPS circuit 1934 and each of the converters 1930 are disabled. When LVP_EN is asserted to a different or opposite logic level such that SW1 enables the LPS circuit 1934 by coupling its lower supply voltage terminal to GND, then the LPS circuit 1934 may then enable any one or more of the converters 1930 to enable the LVP test system 102 to detect and measure constant or low frequency electrical parameters of the DUT 2104.

The illustrated converters detect the input signals VIN or IIN at a specific point in time which is particularly advantageous for electrical parameters that are DC or relatively constant. For low frequency AC signals, however the test equipment 124 may be configured to store multiple iterations over time in which post-processing techniques may be used to evaluate a rate of change of the measured signal over time to determine a corresponding frequency. Alternatively, or in addition, the test equipment 124 may include a frequency analyzer which may be used to determine the frequency of measured signals.

The DUTs with converters may exhibit sample to sample manufacturing variations, so that the frequencies of the converters based on a ring oscillator (e.g., 252, 352, 552, and 652) or the like may vary by a significant amount from one DUT to another thereby rendering the measurements indeterminate or at least less accurate. In one embodiment, a calibration process may be used to normalize measurements of each DUT. In another embodiment as illustrated by FIGS. 22 and 23, normalization may be achieved by pad matching using externally provided known reference values.

Figure 22:
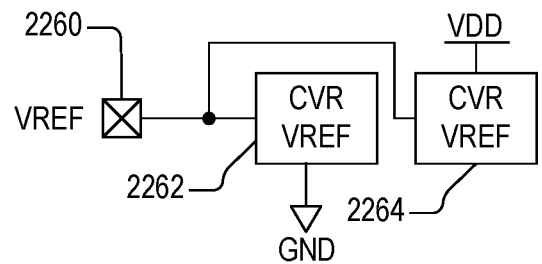
FIG. 22 is a block diagram illustrating various configurations of pad matching that may be used to normalize voltage measurements for a given device under test.

FIG. 22 is a block diagram illustrating various configurations of pad matching that may be used to normalize voltage measurements for a given DUT. The DUT may include an I/O pin 2260 receiving a known reference voltage VREF, although VREF may also be internally provided. The set of converters on the DUT may include one or more voltage reference converters, such as 2262 or 2264, or both, receiving VREF. The voltage reference converter 2262 is referenced to GND and the voltage reference converter 2264 is referenced to VDD. In one embodiment, the reference converters 2262 and 2264 may include ring oscillators for converting VREF to a corresponding reference frequency for detection by the LVP test system 102. In this manner, the test equipment 124 may use the relationship between VREF and the reference frequency to normalize or correct for variances of the frequency to voltage conversion by pads using ring oscillators such as that shown in FIG. 7. In addition or in the alternative, the reference converters 2262 and 2264 or other similar reference converters (not shown) may including charging capacitors, such as those shown in DUTs 1404 and 1604.

Figure 23:
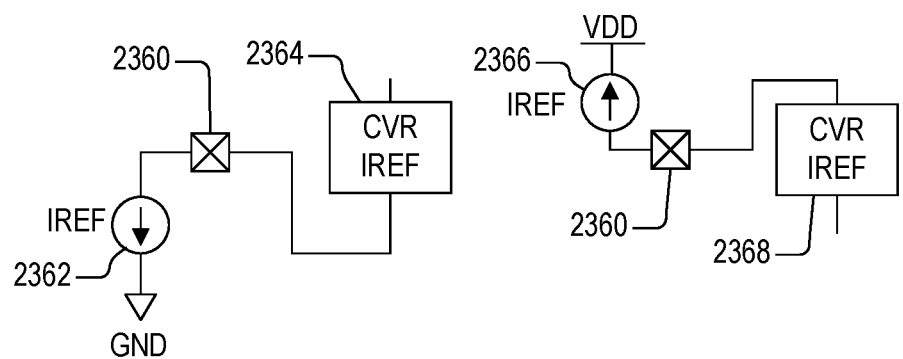
FIG. 23 is a block diagram illustrating various configurations of pad matching that may be used to normalize current measurements for a given device under test.

FIG. 23 is a block diagram illustrating various configurations of pad matching that may be used to normalize current measurements for a given DUT. The DUT may include an I/O pin 2360 sinking or sourcing an external known reference current IREF. An external current sink 2362 referenced to GND may sink IREF via pin 2360 for a current reference converter 2364 referenced to GND, or an external current source 2366 referenced to VDD may source IREF via pin 2360 (or another pin) for a current reference converter 2368 reference to VDD. In one embodiment, the reference converters 2364 and 2366 may include substantially identical ring oscillators for converting IREF to a corresponding reference frequency for detection by the LVP test system 102. In this manner, the test equipment 124 may use the relationship between IREF and the reference frequency to normalize or correct for variances of the frequency to current conversion by pads using ring oscillators such as that shown in FIG. 4. In addition or in the alternative, the reference converters 2364 and 2366 or other similar reference converters (not shown) may including charging capacitors, such as those shown in DUTs 1004 and 1204.

The capacitor charging converters 1030, 1230, 1430 and 1630 are implemented within a design window based on the low frequency cutoff of the LVP test system 102, system jitter, and parasitic parameters. In particular, the targeted rising or falling slope should be less than the slope due to system jitter but greater than the low frequency cutoff of the LVP test system 102. The capacitance of the capacitor C, including parasitic capacitance, may be determined by the pad size. The low frequency cutoff of the LVP test system 102 may be adjusted to a known value, such as, for example, 100 kHz. A reasonable slope limit may be used for system jitter, such as, for example, 10 nanoseconds (ns), although this value may be different for different configurations. These parameters determine a reasonable window for IIN. In one embodiment, for example, IIN may range from 10 nanoamperes (nA) to 10 microamperes (µA). If IIN is outside the target window and the parameters are not readily adjustable, then a different converter type may be used.

Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims. For example, variations of positive logic or negative logic may be used in various embodiments in which the present invention is not limited to specific logic polarities, device types or voltage levels or the like. For example, VDD and GND are supply voltage levels in which each may have any positive or negative voltage level, and VDD may have a higher or lower voltage level relative to GND. Also, alternative supply or reference voltages may be used instead or VDD or GND.

The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

The invention claimed is:

1. An integrated circuit block, comprising:
a sense node that develops a low frequency electrical parameter when the integrated circuit block is powered, wherein said low frequency electrical parameter is constant or varies at a frequency below a predetermined frequency level; and
a converter circuit coupled to said sense node and including a laser probe area, wherein said converter circuit converts said low frequency electrical parameter into an alternating electrical parameter having a frequency at or above said predetermined frequency level sufficient to modulate from a laser beam focused on a point within said laser probe area, a reflected laser beam generated from said laser beam focused on a point within the laser probe area striking said laser probe area are being reflected as the reflected laser beam from said laser probe area.

2. The integrated circuit block of claim 1, wherein:
said low frequency electrical parameter comprises an electrical current; and
wherein said converter circuit comprises:
 a current mirror that mirrors said electrical current as a mirrored current; and
 a ring oscillator coupled in series with said current mirror, wherein said ring oscillator oscillates at a frequency based on a magnitude of said mirrored current.

3. The integrated circuit block of claim 1, wherein:
said low frequency electrical parameter comprises an electrical voltage; and
wherein said converter circuit comprises:
 a conversion device that converts said electrical voltage into an electrical current; and
 a ring oscillator coupled to said conversion device, wherein said ring oscillator oscillates at a frequency based on a magnitude of said electrical voltage.

4. The integrated circuit block of claim 1, wherein:
said low frequency electrical parameter comprises an electrical voltage; and
wherein said converter circuit comprises:
 an electronic device incorporating said laser probe area and coupled between a detect node and a supply voltage, wherein said electronic device develops said alternating electrical parameter;
 a plurality of switches comprising a sense switch and at least one reference switch;
 wherein said sense switch is coupled between said sense node and said detect node;
 wherein each of said at least one reference switch is coupled between said detect node and a corresponding one of at least one reference voltage node, wherein each said at least one reference voltage node has a known voltage level; and
 a switch control circuit that sequentially closes said plurality of switches for each of a plurality of cycles.

5. The integrated circuit block of claim 4, wherein said electronic device comprises a PN junction.

6. The integrated circuit block of claim 4, wherein said at least one reference switch comprises:
 a first reference switch coupled between said detect node and a first reference voltage node; and
 a second reference switch coupled between said detect node and a second reference voltage node.

7. The integrated circuit block of claim 1, wherein:
said low frequency electrical parameter comprises an electrical current; and
wherein said converter circuit comprises:
 a current mirror that mirrors said electrical current as a mirrored current;
 a capacitor coupled in series with said current mirror; and
 a transistor having a current path coupled in parallel with said capacitor and having a control terminal receiving a clock signal.

8. The integrated circuit block of claim 1, wherein:
said low frequency electrical parameter comprises an electrical voltage; and
wherein said converter circuit comprises:
 a first transistor having a control input receiving said electrical voltage and having a current path that converts said electrical voltage into an electrical current;
 a capacitor coupled in series with said current path of said first transistor; and
 a second transistor having a current path coupled in parallel with said capacitor and having a control terminal receiving a clock signal.

9. An integrated circuit block, comprising:
 a sense node that develops a low frequency electrical parameter when the integrated circuit block is powered, wherein said low frequency electrical parameter is constant or varies at a frequency below a predetermined frequency level; and
 a converter circuit coupled to said sense node and including a laser probe area, wherein said converter circuit converts said low frequency electrical parameter into an alternating electrical parameter having a frequency at or above said predetermined frequency level sufficient to modulate a laser beam focused on a point within said laser probe area;
 wherein said low frequency electrical parameter comprises an electrical voltage; and
 wherein said converter circuit comprises:
  an electronic device incorporating said laser probe area and coupled between a detect node and a supply voltage, wherein said electronic device develops said alternating electrical parameter;
  a plurality of switches comprising a sense switch and at least one reference switch;
  wherein said sense switch is coupled between said sense node and said detect node;
  wherein each of said at least one reference switch is coupled between said detect node and a corresponding one of at least one reference voltage node, wherein each said at least one reference voltage node has a known voltage level; and
  a switch control circuit that sequentially closes said plurality of switches for each of a plurality of cycles.

10. The integrated circuit block of claim 9, wherein said electronic device comprises a PN junction.

11. The integrated circuit block of claim 9, wherein said at least one reference switch comprises:
 a first reference switch coupled between said detect node and a first reference voltage node; and
 a second reference switch coupled between said detect node and a second reference voltage node.

12. An integrated circuit block, comprising:
 a sense node that develops a low frequency electrical parameter when the integrated circuit block is powered, wherein said low frequency electrical parameter is constant or varies at a frequency below a predetermined frequency level; and
 a converter circuit coupled to said sense node and including a laser probe area, wherein said converter circuit converts said low frequency electrical parameter into an alternating electrical parameter having a frequency at or above said predetermined frequency level sufficient to modulate a laser beam focused on a point within said laser probe area;
 wherein said low frequency electrical parameter comprises an electrical current; and
 wherein said converter circuit comprises:
  a current mirror that mirrors said electrical current as a mirrored current;
  a capacitor coupled in series with said current mirror; and
  a transistor having a current path coupled in parallel with said capacitor and having a control terminal receiving a clock signal.

13. An integrated circuit block, comprising:
  a sense node that develops a low frequency electrical parameter when the integrated circuit block is powered, wherein said low frequency electrical parameter is constant or varies at a frequency below a predetermined frequency level; and
  a converter circuit coupled to said sense node and including a laser probe area, wherein said converter circuit converts said low frequency electrical parameter into an alternating electrical parameter having a frequency at or above said predetermined frequency level sufficient to modulate a laser beam focused on a point within said laser probe area;
  wherein said low frequency electrical parameter comprises an electrical voltage; and
  wherein said converter circuit comprises:
    a first transistor having a control input receiving said electrical voltage and having a current path that converts said electrical voltage into an electrical current;
    a capacitor coupled in series with said current path of said first transistor; and
    a second transistor having a current path coupled in parallel with said capacitor and having a control terminal receiving a clock signal.

* * * * *